(12) United States Patent
Nakahara et al.

(10) Patent No.: US 8,891,570 B2
(45) Date of Patent: Nov. 18, 2014

(54) OPTICAL SEMICONDUCTOR DEVICE

(71) Applicant: Oclaro Japan, Inc., Kanagawa (JP)

(72) Inventors: Kouji Nakahara, Tokyo (JP); Yuki Wakayama, Tokyo (JP); Takeshi Kitatani, Tokyo (JP); Kazunori Shinoda, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 13/761,755

(22) Filed: Feb. 7, 2013

(65) Prior Publication Data
US 2013/0208751 A1    Aug. 15, 2013

(30) Foreign Application Priority Data

Feb. 9, 2012    (JP) .................................. 2012-026749

(51) Int. Cl.
| | | |
|---|---|---|
| *H01S 5/00* | (2006.01) | |
| *H01S 5/227* | (2006.01) | |
| *H01S 5/34* | (2006.01) | |
| *H01S 5/22* | (2006.01) | |
| *H01S 5/32* | (2006.01) | |
| *H01S 5/343* | (2006.01) | |
| *H01S 5/30* | (2006.01) | |
| *H01S 5/028* | (2006.01) | |
| *H01S 5/20* | (2006.01) | |
| *H01S 5/12* | (2006.01) | |

(52) U.S. Cl.
CPC ............. *H01S 5/3403* (2013.01); *H01S 5/2222* (2013.01); *H01S 5/3201* (2013.01); *H01S 5/34306* (2013.01); *H01S 5/2275* (2013.01); *H01S 5/0021* (2013.01); *H01S 5/3095* (2013.01); *H01S 5/2226* (2013.01); *H01S 5/2224* (2013.01); *H01S 5/0287* (2013.01); *H01S 5/3213* (2013.01); *H01S 5/2213* (2013.01); *H01S 2301/176* (2013.01); *H01S 5/209* (2013.01); *H01S 5/12* (2013.01); *H01S 5/2201* (2013.01); *H01S 5/2206* (2013.01)
USPC ................. 372/45.011; 372/43.01; 372/45.01

(58) Field of Classification Search
USPC ................... 372/43.01, 45.01, 45.011, 46.01, 372/46.013
See application file for complete search history.

(56) References Cited

U.S. PATENT DOCUMENTS

| | | | | |
|---|---|---|---|---|
| 4,315,226 A | * | 2/1982 | Chinone et al. ............. | 372/45.01 |
| 4,426,700 A | * | 1/1984 | Hirao et al. ..................... | 322/45 |

(Continued)

FOREIGN PATENT DOCUMENTS

| | | |
|---|---|---|
| JP | 63-169094 A | 7/1988 |
| JP | 09-045999 A | 2/1997 |

(Continued)

OTHER PUBLICATIONS

Kazutoshi Saito et al. "Burried-Heterostructure AlGaAs Laser" IEEE, 1980 pp. 205-214.*

(Continued)

*Primary Examiner* — Colleen A Matthews
*Assistant Examiner* — Delma R Forde
(74) *Attorney, Agent, or Firm* — Mattingly & Malur, PC

(57) ABSTRACT

In a BH laser which uses InGaAlAs-MQW in an active layer, Al-based semiconductor multi-layer films including an InP buffer layer and an InGaAlAs-MQW layer, and an InGaAsP etching stop layer are formed in a mesa shape, and a p type InP burial layer is buried in side walls of the mesa shape. An air ridge mesa-stripe of a lateral center that is substantially the same as that of the mesa shape is formed on the mesa shape. According to the present structure, a leakage current can be considerably reduced, the light confinement coefficient can be made to be larger than in a BH laser in the related art, and thereby it is possible to implement a semiconductor laser with a low leakage current and a high relaxation oscillation frequency.

14 Claims, 19 Drawing Sheets

(56) References Cited

U.S. PATENT DOCUMENTS

| | | | |
|---|---|---|---|
| 4,907,239 A * | 3/1990 | Hayakawa et al. | 372/46.01 |
| 4,928,285 A * | 5/1990 | Kushibe et al. | 372/45.01 |
| 6,287,884 B1 * | 9/2001 | Jie et al. | 438/39 |
| 6,821,801 B1 * | 11/2004 | Sato et al. | 438/22 |
| 7,145,930 B2 * | 12/2006 | Honkawa et al. | 372/46.01 |
| 7,701,993 B2 * | 4/2010 | Iga et al. | 372/46.01 |
| 7,889,773 B2 * | 2/2011 | Akiyama | 372/43.01 |
| 8,270,446 B2 * | 9/2012 | Shiota et al. | 372/43.01 |
| 2002/0071462 A1 * | 6/2002 | Takemoto et al. | 372/43 |
| 2004/0048406 A1 * | 3/2004 | Ikeda et al. | 438/29 |
| 2005/0040415 A1 * | 2/2005 | Kish et al. | 257/97 |
| 2006/0209914 A1 * | 9/2006 | Takada et al. | 372/46.01 |
| 2006/0285560 A1 * | 12/2006 | Nagashima et al. | 372/19 |
| 2008/0049805 A1 * | 2/2008 | Takiguchi et al. | 372/46.01 |
| 2010/0328753 A1 * | 12/2010 | Hayashi et al. | 359/279 |
| 2011/0090928 A1 * | 4/2011 | Kaida et al. | 372/46.012 |

FOREIGN PATENT DOCUMENTS

| | | |
|---|---|---|
| JP | 2008-053649 A | 3/2008 |
| JP | 2010-135506 A | 6/2010 |

OTHER PUBLICATIONS

Mitsunori Sugimoto et al. "InGaAsP/InP Current Confinement Mesa Substrate Buried Heterostructure Laser Dios Fabricated by One-Step Liquid-Phase Epitaxy" Journal of Lightwave Technology, vol. LT-2, No. 4, Aug. 1987, pp. 496-503.*

Nakahara, K. et al.; "12.5-Gb/s Direct Modulation Up to 115° C. in 1.3-μm InGaAlAs-MQW RWG DFB Lasers With Notch-Free Grating Structure"; IEEE Journal of Lightwave Technology; Jan. 2004; pp. 159-165; vol. 22, No. 1.

Kurosaki, T. et al.; "Dynamic Properties of a 1.3 μm Light-Emission-and-Detection (LEAD) Diode with a High Mesa Semi-Insulating BH for Subscriber TCM Transmission"; IEEE Journal of Lightwave Technology; Nov. 1996; pp. 2558-2566; vol. 14, No. 11.

Ohkura, Y. et al.; "Low Threshold FS-BH Laser on p-InP Substrate Grown by ALL-MOCVD"; Electronics Letters; Sep. 10, 1992; pp. 1844-1845; vol. 28, No. 19.

Otsubo, K. et al.; "1.3 μm AlGaInAs Multiple-Quantum-Well Semi-insulating Buried-Heterostructure Distributed-Feedback Lasers for High-Speed Direct Modulation"; IEEE Journal of Selected Topics in Quantum Electronics; May/Jun. 2009; pp. 687-693; vol. 15; No. 3.

* cited by examiner

OPTICAL SEMICONDUCTOR DEVICE

CROSS-REFERENCE TO RELATED APPLICATION

The present application claims priority from Japanese application JP2012-026749 filed on Feb. 9, 2012, the content of which is hereby incorporated by reference into this application.

BACKGROUND OF THE INVENTION

1. Field of the Invention

The present invention relates to an optical semiconductor device which is a laser device using a semiconductor, and particularly to a communication semiconductor laser used as a transmission light source of an optical fiber.

2. Description of the Related Art

The Internet becomes established as an infrastructure which is vital for modern society from the business to the home life, and enlarges its range of applications from data communication and blogs to mail order sales, moving pictures, electronic books, SNS (Social Network Service), and the like. With the enlargement of the range of applications, the traffic volume of the optical network supporting the Internet keeps on increasing. Thereby, there has been an increase in demands for optical communication transmission and reception modules which connect between high-speed router devices at a relatively short distance. A transmission rate becomes increasingly high up to 25 Gb/s to 40 Gb/s or more from 10 Gb/s in the related art. At 100 Gb/s which has been recently standardized, four different wavelengths are wavelength-multiplexed at a rate of 25 Gb/s for each channel, thereby realizing large capacity transmission. Currently, an absorption modulator integrated laser is put into a practical laser at a lane speed of 25 Gb/s or more. However, there are strong requests for miniaturization, low power consumption, and low costs, and there are wishes for high speed of a direct modulation laser, a low threshold current, a low current driving operation, and an operation at a wide range temperature from room temperature to high temperature. Particularly, the low threshold current of a semiconductor laser and the high speed in a low current driving condition are important in reducing power consumption of the overall high-speed optical module.

As disclosed in IEEE Journal of Lightwave Technology, Vol. 22, pp. 159 to 165, 2004 by the inventor Kouji Nakahara, et al., in a communication semiconductor laser of a transmission rate of 10 Gb/s or more, a ridge type laser is mainly used in which an InGaAlAs-MQW layer where a relaxation oscillation frequency is high and thus high speed can be realized is applied to an active layer.

A well-known structure which restricts leakage of a current in a semiconductor laser is a burial type (BH: buried heterostructure) laser, and there are a semi-insulating semiconductor BH laser in which a high resistance InP laser is grown up to an upper p type contact layer side, which is disclosed by Takeshi Kurosaki, et al. (IEEE Journal of Lightwave Technology Vol. 14, pp. 2558 to 2566, 1996.), and a pn type BH layer using reverse current blocking of a pn junction as disclosed in JP2010-135506A or disclosed by Y. Ohkura, et al. (Electronics Letters, Vol. 28, pp. 1844 to 1845, 1992.). In recent years, in order to improve characteristics of the ridge type laser, research and development of a BH laser which uses InGaAlAs-MQW in an active layer has been activated, and there has been proposed a semi-insulating semiconductor BH laser disclosed by Koji Otsubo, et al. (IEEE Journal of Selected Topics in QuantumElectronics, Vol. 15, pp. 687 to 693, 2009.) or a pn type BH laser disclosed in JP2008-053649A.

In addition, there are configurations disclosed in JP9-45999A and JP63-169094A as similar laser structures for reducing a leakage current. The configuration disclosed in JP9-45999A has a structure in which an Fe—InP layer is buried in both sides of the ridge structure in a stripe shape. In JP63-169094A, current constriction is realized by putting disordering the vicinity of an active layer outside a ridge using impurities.

SUMMARY OF THE INVENTION

In the ridge type laser, since there is a diffusion current in a transverse direction in a semiconductor layer under an air ridge stripe, an effective active layer is spread, and since a current is diffused to further outside thereof, there is a reactive current which thus increases a threshold current. The relaxation oscillation frequency fr has the following relationship between a driving current Im (=Operating current−threshold current), the width Wa of the active layer, and the length Lc of the active layer.

Expression 1

$$f_r \propto \sqrt{\frac{I_m}{L_c W_a}} \quad (1)$$

The ridge type laser can be said to be a disadvantageous structure for increasing the relaxation oscillation frequency fr since the effective driving current is reduced by the influence of the reactive current due to the diffusion current in the transverse direction and thus the width of the effective active layer also increases. In buried type lasers disclosed in Non-Patent Document 2, Patent Document 1 and Non-Patent Document 4, there is no diffusion current in the transverse direction in the ridge type laser, and thus the width of the active layer is not spread and is determined by the width of a mesa-stripe.

Generally, a threshold current is smaller in the pn type BH laser than in the semi-insulating semiconductor BH laser. In a case of using an InP substrate, the BH type laser has been employed in a laser which uses an InGaAsP layer, particularly an InGaAsP quantum well layer as an active layer and put into practical use.

However, in the semi-insulating semiconductor BH laser disclosed in Non-Patent Document 3 or the pn type BH laser disclosed in Patent Document 2, an extent of a ridge type threshold current to be reduced is smaller than in a case where InGaAsP is used in the active layer. In addition, the BH laser has a problem in that current dependency of the relaxation oscillation frequency is not improved although a current is constricted. Further, one of the fundamental problems of the BH laser is poor high-temperature characteristics regardless of an active layer. In other words, the BH laser has a problem in that a threshold current is low at room temperature and the threshold current is high at a high temperature. In addition, in a case of the pn type BH laser, there is a problem in that a high-speed modulation operation cannot be performed due to parasitic capacitance caused by the pn junction of the burial layer.

In addition, in the ridge structure of Patent Document 3, the Fe—InP layer provided in both sides of the ridge is laterally shifted by 2 μm or more from a ridge stripe with respect to an allowance of a photolithography process. This lateral shift is a factor which leads the light transverse mode of a semiconductor laser to lateral asymmetry and thus causes a multimode. Further, since a current to the active layer is laterally asymmetric, a transverse mode tends to become a multimode, or a beam steering phenomenon, in which light beams fluctuate horizontally, tends to occur. This is fatal in an optical communication semiconductor laser. In order to prevent it, the ridge stripe and the Fe—InP burial layer are required to be separated from each other as shown in FIG. 8 of Patent Document 3. In this state, the width of an effective mesa-stripe increases, and characteristics are close to the ridge type laser. Therefore, favorable current constriction cannot be obtained, an effect of reducing a threshold current is low, and a high speed property cannot be expected.

In addition, in a case of introducing impurities as in a case of Patent Document 4, a defective crystal occurs since the crystal is damaged. The defective crystal can be recovered through an annealing process after ion implanting in an Si semiconductor; however, it is difficult to completely recover the defective crystal due to the impurity introduced through the annealing in a compound semiconductor used in the semiconductor laser. Therefore, in Patent Document 4, there is a problem in terms of reliability since a leakage current flows due to the defective crystal, which causes a new defective crystal, and thus a leakage current increases with the passage of time.

An object of the present invention is to provide a semiconductor laser which uses InGaAlAs in an active layer and has long-term reliability since a threshold current is small, a relaxation oscillation frequency at a low driving current is high, and temperature characteristics are good. Another object of the present invention is to provide a semiconductor laser showing a stable operation in a state where a transverse mode is a base mode in addition to the above description. In addition, still another object of the present invention is to provide a semiconductor laser which has small parasitic capacitance and can be operated at high speed in addition to the above description. Further, still another object of the present invention is to provide an optical semiconductor device having the above-described structures.

According to an aspect of the present invention, there is provided an optical semiconductor device formed on an InP semiconductor substrate, including a first clad layer that is of a first conductivity type and has an air ridge shape; a first conductivity type semiconductor layer that is disposed on a lower layer side which is the InP semiconductor substrate side of the first clad layer and includes at least one layer having a composition different from a composition of the first clad layer; Al-based semiconductor multi-layer films that are disposed on the lower layer side of the first conductivity type semiconductor layer, are formed by overlapping a plurality of semiconductor layers including an Al element, and have a quantum well active layer; a second clad layer that is disposed on the lower layer side of the Al-based semiconductor multi-layer films and is of a second conductivity type; and at least one burial semiconductor layer that comes into contact with two opposite common side walls formed by the first conductivity type semiconductor layer and the Al-based semiconductor multi-layer films, wherein an end surface of an upper layer side of the burial semiconductor layer includes a surface which has substantially the same height as an end surface of an upper surface side of the first conductivity type semiconductor layer, and a lower layer side thereof extends so as to cover at least the Al-based semiconductor multi-layer films.

Here, the "first conductivity type" indicates one of a p type and an n type, and the "second conductivity type" indicates the other type. In addition, the end surface of the upper layer side of the burial semiconductor layer may partially include a surface which has substantially the same height as the end surface of the upper surface side of the first conductivity type semiconductor layer, and does not necessarily have the same height over the entire surface.

According to another aspect of the present invention, there is provided an optical semiconductor device formed on an InP semiconductor substrate, including a first clad layer that is of a first conductivity type and has an air ridge shape; a first conductivity type semiconductor layer that is disposed on a lower layer side which is the InP semiconductor substrate side of the first clad layer and includes at least one layer having a composition different from a composition of the first clad layer; Al-based semiconductor multi-layer films that are disposed on the lower layer side of the first conductivity type semiconductor layer, are formed by overlapping a plurality of semiconductor layers including an Al element, and have a quantum well active layer; a second clad layer that is disposed on the lower layer side of the Al-based semiconductor multi-layer films and is of a second conductivity type; and a burial semiconductor layer that comes into contact with two opposite common side walls formed by the first conductivity type semiconductor layer and the Al-based semiconductor multi-layer films, wherein a central axis of a shape formed by the first conductivity type semiconductor layer and the Al-based semiconductor multi-layer films interposed between the side walls is a central axis of a shape of the first clad layer.

Each of the above-described optical semiconductor devices may further include at least one lower-layer side burial layer that is formed on the lower layer side of the burial layer and is formed so as to be separated from the common side walls.

In the above-described optical semiconductor devices, the Al-based semiconductor multi-layer films may include an SCH layer formed of an n type InGaAsP layer. In addition, the burial layer may be made of a p type semiconductor, or may be doped with Ru as a dopant.

In addition, in the above-described optical semiconductor devices, the first conductivity type semiconductor layer may include InGaAsP or InGaAlAs.

Each of the above-described optical semiconductor devices may further include an oxide film that is provided on the upper layer side of the burial semiconductor layer and the side surface of the first clad layer; and an organic insulating film or a low-stress inorganic insulating film that is provided so as to cover the side surface of the first clad layer on an upper layer side of the oxide film.

In the above-described optical semiconductor devices, a width of the first conductivity type semiconductor layer, a width of the Al-based semiconductor multi-layer films, and a width of the first clad layer, which are determined by a distance between the common side walls, may be substantially the same.

Therefore, according to the optical semiconductor device of the present invention, it is possible to realize a low threshold current, a high relaxation oscillation frequency, and high reliability in a BH laser which has an active layer including Al-based elements.

DETAILED DESCRIPTION OF THE INVENTION

Figure 4:
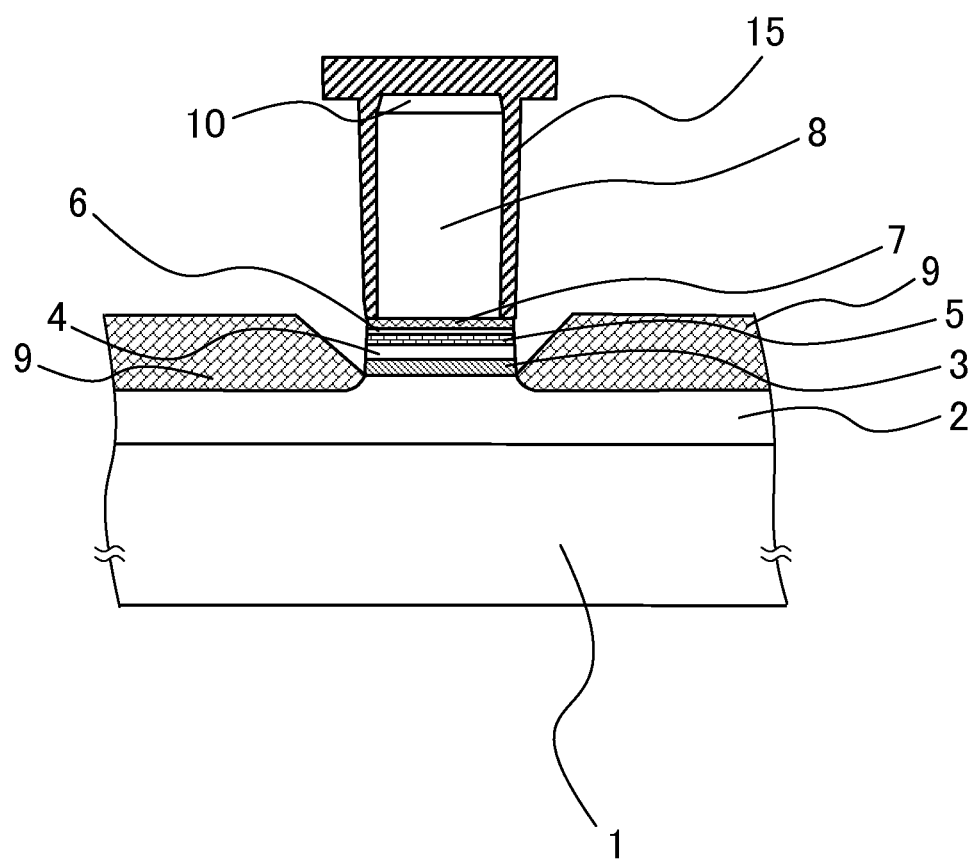
FIG. 4 is a diagram illustrating a state where a burial layer is formed when there are no eaves.

As a result that the inventor of the present invention has diligently conducted a study, a new self-alignment method has been developed, and thus forming a semiconductor layer including an active layer in a mesa shape directly under an air ridge mesa-stripe shape has been successful. With this method, the lateral center of the air ridge mesa-stripe can conform to the lateral center of the mesa-semiconductor layer including the active layer. In addition, in a case where a mesa shape including multi-layer films having Al-based elements is buried in a special $SiO_2$ mask in which the air ridge mesa-stripe is formed on an upper portion and which is covered by an insulating film, if there are no eaves of an insulating film on both sides of the lower end of the air ridge stripe, it has first been found that the multi-layer films (hereinafter, referred to as Al-based multi-layer films) including Al-based elements are not buried. In other words, in a case where there are no eaves as shown in FIG. 4, a burial layer is not grown on side walls of the Al-based multi-layer films. The eaves can be created without being shifted with the above-described self-alignment method. It is considered that the burial layer in the vicinity under the eaves is appropriately suppressed from being grown due to the presence of the eaves and is thus grown on the side walls of the Al-based multi-layer films. Further, it has been found for the first time that, when the burial layer is grown, the layer is first grown on a side wall region of the semiconductor layer under the Al-based multi-layer films and then is buried in parallel to the substrate. In the structure in the related art, the burial layer was formed on all side walls including the active layer from an initial stage of the growth as in Patent Document 2.

Since lateral centers of the air ridge stripe and the mesa semiconductor layer including the active layer can be made to conform to each other using a BH semiconductor structure of the present invention, it is difficult for beam steering due to asymmetry of light distributions or asymmetry of currents to occur, and light stably travels through the stripe in a state where a transverse mode is a base mode. In addition, the reason why a threshold current cannot be reduced so much in the BH laser using InGaAlAs-MQW in an active layer is that the InP burial layer and the Al-based multi-layer films are of Type-II, and thus a notch is formed at an interface therebetween and a channel in a two-dimensional electron gas state occurs, and thus it has been estimated that leakage between upper and low clads occurs. According to the present BH structure, the air ridge mesa-stripe and the burial layer are substantially separated from each other, and thus there is little leakage current from the side walls and thus the threshold current can be considerably reduced. In addition, since the active layer is located under the air ridge stripe such that lateral centers conform to each other according to the BH semiconductor structure of the present invention, a light confinement coefficient increases as compared with a typical BH structure since a refractive index difference from the semiconductor increases due to an insulating substance on the side wall of the air ridge stripe. This effect can realize a decrease in the threshold current and an increase in the relaxation oscillation frequency.

In addition, generally, in a BH structure, the burial layer may necessarily be formed of a semi-insulating semiconductor layer in order to achieve low capacitance. This is because, in a typical pn type BH structure, capacitors due to pn junctions at respective locations are connected in parallel in a semiconductor laser. In the BH semiconductor structure of the present invention, since the area in which the burial layer comes into contact with one conductivity type is very small, and thus a capacitance of a pn junction which is formed in a burial structure can be made to be effectively very small. To use a semi-insulating semiconductor in the burial layer is more favorable for leakage of electrons from the active layer or the SCH layer than to use a p type semiconductor. This is because the p type semiconductor can make a barrier of the conduction band side larger from a position of the Fermi level. Even in a case where the burial layer and the active layer or the SCH layer are of Type-II, the p type semiconductor layer can make a two-dimensional electron channel occurring at the interface smaller.

Further, since a burial layer coming into contact with a second clad layer and a layer coming into contact with the Al-based multi-layer films located on the second clad layer are clearly buried and separated, an ideal burial form which does not exist in the related art can be formed according to the BH semiconductor structure. Thereby, it is possible to realize favorable current constriction. Through the above-described effects, it is possible to realize a semiconductor laser in which a threshold current is low, an increase in the threshold current is small at high temperature, that is, temperature characteristics are good, a relaxation, oscillation frequency is high, and parasitic capacitance is small as characteristics of the semiconductor laser. In addition, an MQW active layer or aside wall such as an SCH layer in the vicinity thereof are buried by the semiconductor layer, thus a structure without a defective crystal at the side wall interface can be provided, and thereby it is possible to realize reliability for a long time which is required in a communication semiconductor laser.

Hereinafter, embodiments related to the optical semiconductor device of the present invention which has been obtained through the above-described study will be described with reference to the drawings. In addition, in the drawings, the same reference numerals are given the same or equivalent elements, and repeated description will be omitted.

[Embodiment 1]

Figure 1:
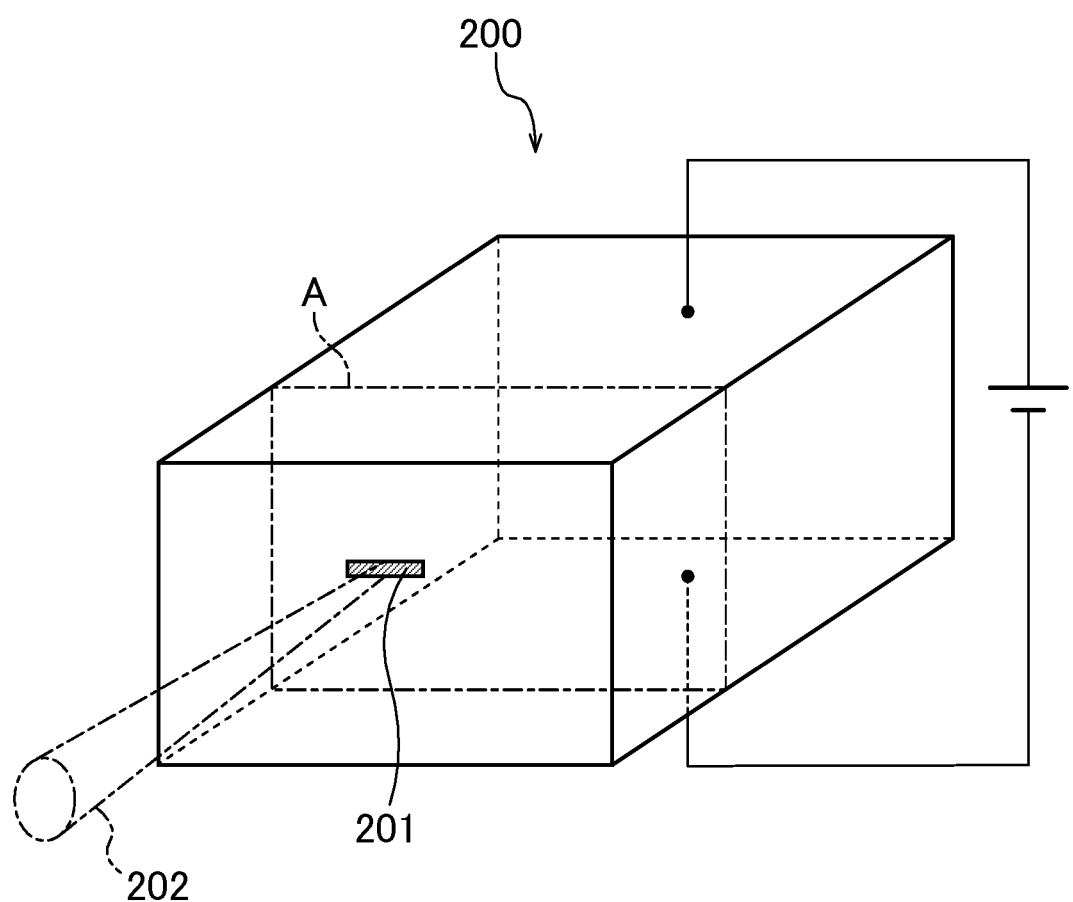
FIG. 1 is a diagram schematically illustrating a semiconductor laser device which is an optical semiconductor device of the present invention.

FIG. 1 schematically shows a semiconductor laser device 200 which is an optical semiconductor device related to Embodiment 1 of the present invention. As shown in this figure, the semiconductor laser device 200 is a device where laser light 202 is oscillated from an oscillation region 201 by applying voltages to two electrodes provided in opposite surfaces of a rectangular parallelepiped.

Figure 2:
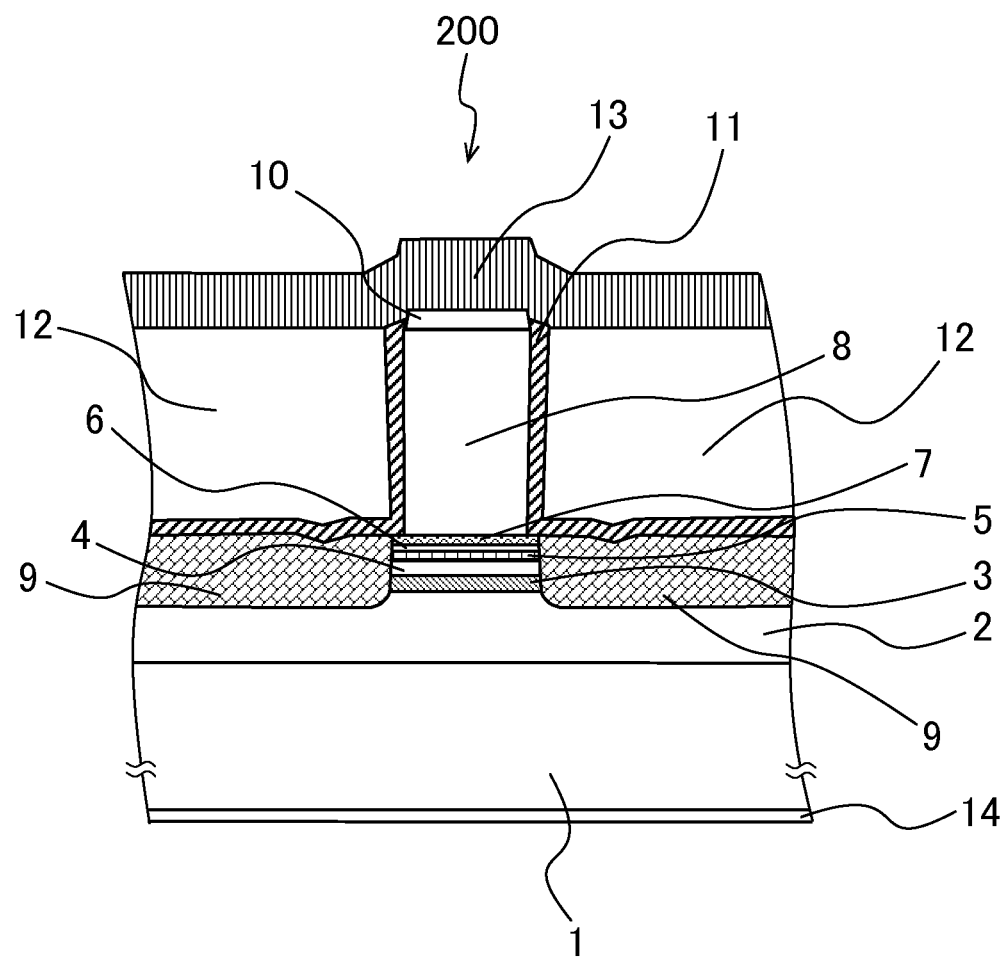
FIG. 2 is a cross-sectional view in a surface which is perpendicular to laser light, indicated by A of FIG. 1.

FIG. 2 is a cross-sectional view in the cross-section indicated by A of FIG. 1, and is a schematic diagram of the cross-section perpendicular to an optical axis of a semiconductor laser which is oscillated in a 1.3 μm band of an optical fiber communication transmission light source. As shown in this figure, the semiconductor laser device 200 includes an n type InP substrate 1; an n type InP buffer layer 2 which is a lower clad layer of which the doping concentration is $1 \times 10^{18}$ cm$^{-3}$ and the thickness is 500 nm; an n type InGaAlAs-SCH layer 3, disposed under MQW, of which the doping concentration is $1 \times 10^{18}$ cm$^{-3}$, the thickness is 100 nm, and the composition wavelength is 0.93 μm; a strained InGaAlAs-MQW layer 4 which has a well layer 5.5 nm thick and a barrier layer 7 nm thick in seven cycles and is oscillated in a 1.3 μm band; a p type InGaAlAs-SCH layer 5 of which the doping concentration is $8 \times 10^{17}$ cm$^{-3}$, the thickness is 30 nm, and the composition wavelength is 0.93 μm; a p type InAlAs electron stop layer 6 of which the doping concentration is $1 \times 10^{18}$ cm$^{-3}$ and the thickness is 50 nm; a p type InGaAsP etching stop layer 7 of which the doping concentration is $8 \times 10^{17}$ cm$^{-3}$ and the thickness is 30 nm; a p type InP clad layer 8 of the doping concentration $1 \times 10^{18}$ cm$^{-3}$ which is an upper clad layer and forms an air ridge of the height 1.5 μm; a p type InP burial layer 9 with the doping concentration of $3 \times 10^{17}$ cm$^{-3}$; an InGaAs contact layer 10; an SiO$_2$ insulating film 11; an organic insulating film 12 such as polyimide; a p type electrode 13 formed of Ti/Pt/Au; and an n type electrode 14 which uses AuGe-based elements in a contact electrode. The width of the lower end of the air ridge of the p type InP clad layer 8 is 1.5 μm. The organic insulating layer 12 may use an inorganic material as long as it shows a low stress. In the following description, the n type InGaAlAs-SCH layer 3, the strained InGaAlAs-MQW layer 4, and the p type InGaAlAs-SCH layer 5 are collectively simply referred to as "Al-based semiconductor multi-layer films" or "Al-based multi-layer films". The p type InGaAsP etching stop layer 7 is also referred to as a "conductive semiconductor layer". Here, the p type InGaAsP etching stop layer 7 is a p type semiconductor layer having a composition different from that of the p type InP clad layer 8.

Figure 3:
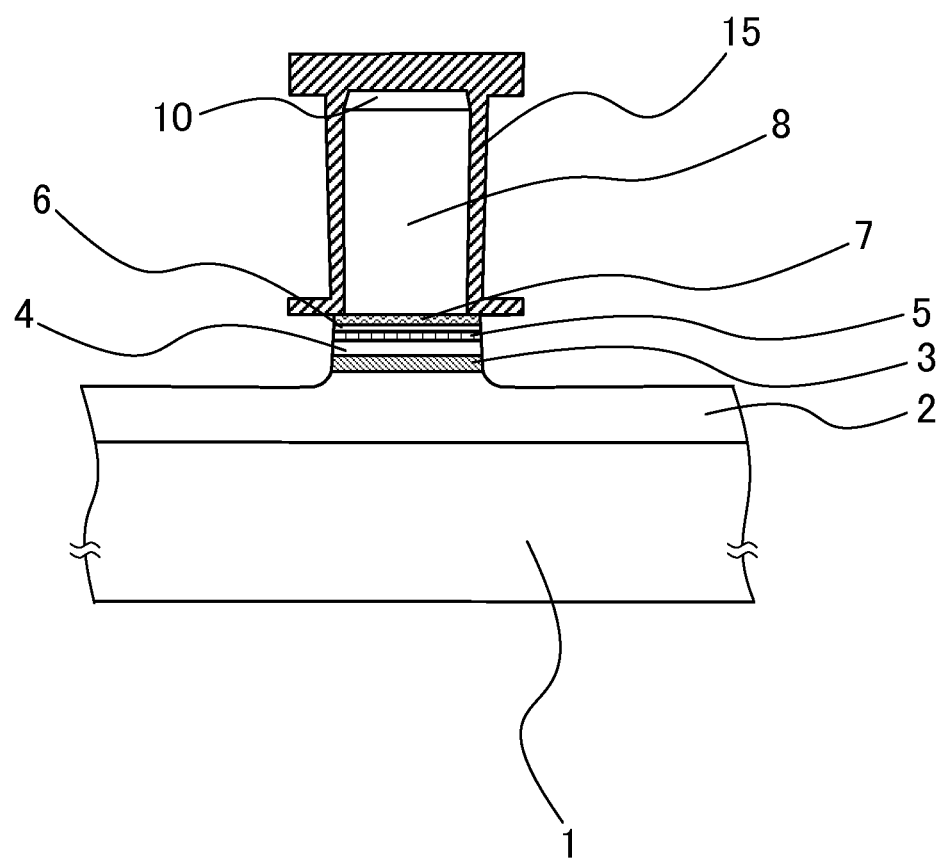
FIG. 3 is a cross-sectional view immediately after Al-based semiconductor multi-layer films are formed in a mesa shape.

Here, a brief description will be made of a self-alignment method in which the Al-based multi-layer films including an active layer are formed in a mesa shape such that lateral centers conform with respect to the air ridge stripe. FIG. 3 is a schematic diagram of the cross-section perpendicular to the stripe axis immediately after the Al-based semiconductor multi-layer films under the air ridge stripe are formed in a mesa shape. In FIG. 3, an SiO$_2$ mask 15 for burial growth is first manufactured such that eaves are formed in an SiO$_2$ mask used to form the air ridge stripe. This shape is obtained by wet-etching the InGaAs contact layer 10.

Successively, selective wet etching is performed using a mixed solution of HCl and H$_3$PO$_4$, thereby forming the p type InP clad layer 8 in a ridge stripe shape. At this time, the etching is stopped by the etching stop layer 7. Successively, SiO$_2$ is formed again using thermal CVD or the like. In addition, regions corresponding to eaves are formed in an SiO$_2$ film on the etching stop layer 7 through dry etching by using the upper eaves as a mask.

Successively, through dry etching or wet etching, a portion of the buffer layer 2 corresponding to the n type InGaAlAs-SCH layer 3 and the lower clad layer from the etching stop layer 7 is etched. The etching depth is 0.45 μm. At this time, the eaves as shown in FIG. 2 can be formed in lateral symmetry with respect to the air ridge stripe through side etching. This step is a self-alignment step in which there is no photolithography step except for the initial SiO$_2$ mask 15, and thus the eaves can be formed in lateral symmetry with respect to the air ridge. In the present embodiment, the width of the etching stop layer 7 is 1.52 μm which is a little larger than the width of the air ridge. In addition, the length of each of the eaves from the lower end of the air ridge is 0.42 μm.

After forming the mesa shape of FIG. 3, the p type InP burial layer 9 is buried in the doping concentration $3 \times 10^{17}$ cm$^{-3}$ using MOCVD. The burial thickness is the height of the eaves, that is, the side walls of the Al-based multi-layer films are sufficiently buried, and the layer 9 is buried until further reaching up to the etching stop layer.

Since the p type InP burial layer 9 is buried along under the eaves if buried up to the eaves, the burial layer 9 extends in the transverse direction and has approximately the same height on both sides around at least the uppermost portion of the mesa shape, that is, around the upper end surface of the conductive semiconductor layer after being grown. The burial layer typically becomes parallel to the substrate. However, if a force is received when the eaves are grown thin, the eaves are curved due to thermal expansion, or a burial time is short, the burial layer does not become parallel but is tilted slightly. A preferable range thereof is −45° to +30° when a downward angle is negative.

When there are no eaves, as shown in FIG. 4, the burial layer 9 is not grown on the side walls of the Al-based semiconductor multi-layer films and is stopped at the layer which does not include Al, and has a shape in which the (111)B face is exposed outward therefrom. This is because a lot of source gases may migrate from the overlying SiO$_2$ mask with the air ridge shape, and thus the InP layer on which the growth is easily performed, here, the burial layer may be grown fast on the n type InP buffer layer 2. In addition, if the burial layer may be grown such that the (111)B face is exposed, the side walls of the Al-based semiconductor multi-layer films seem to be placed in a groove, thus an amount of source gases to be supplied may be small, and thereby the burial layer may not be grown. Since the growth is suppressed around the n type InP buffer layer 2 in which growth is easily performed, due to the presence of the eaves, the semiconductor may also bury the side walls of the Al-based semiconductor multi-layer films. The length of the eaves in which the semiconductor buries the side walls of the Al-based semiconductor multi-layer films was 80 nm to 1.5 μm. In addition, from the detailed study, in relation to an etching depth, morphology of a semiconductor surface after burial growth is performed is not good in a state where etching is stopped in the middle of the Al-based semiconductor multi-layer films and the Al-based semiconductor multi-layer films are exposed to the etched bottom surface. In relation to the etching depth, the lowermost portion or less of the Al-based semiconductor multi-layer films is required to be etched. The maximum value of a preferable etching depth is 2 μm from the lowermost portion of the Al-based semiconductor multi-layer films from the viewpoint of the Al-based side walls being buried.

Figure 5:
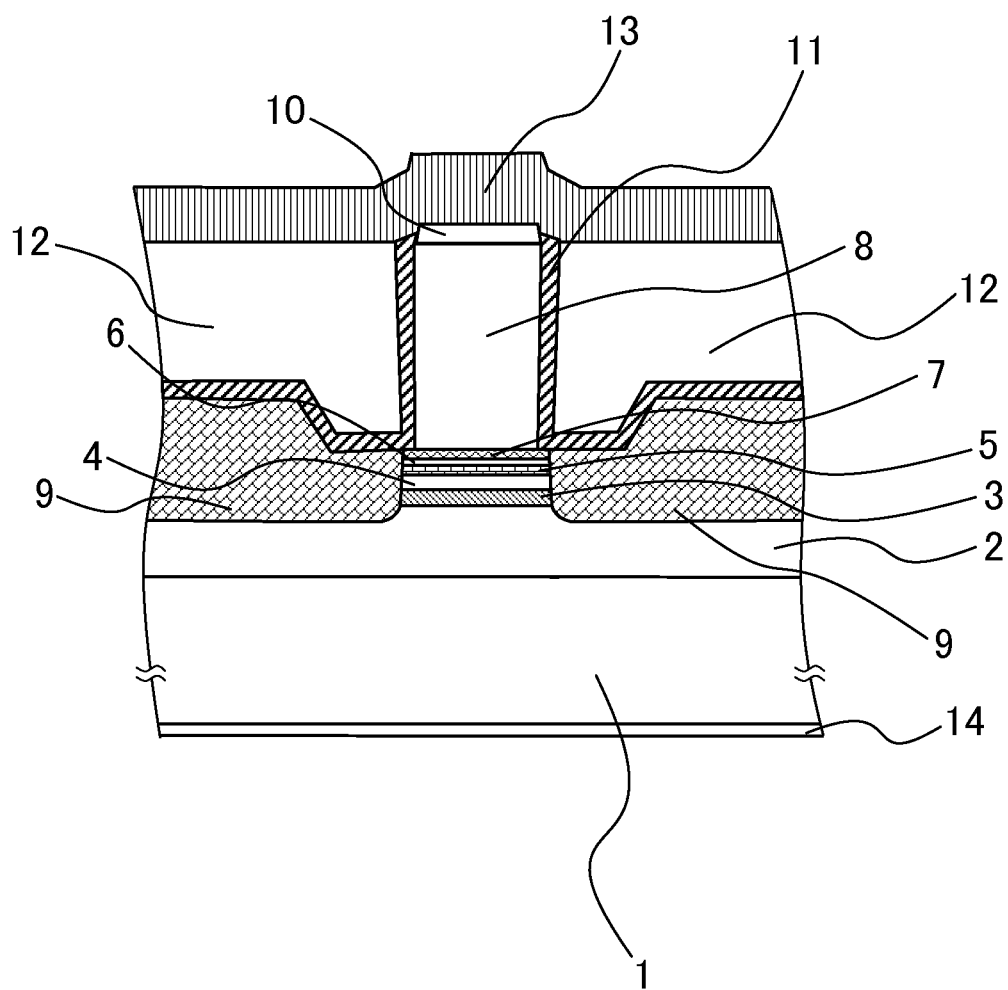
FIG. 5 is a diagram illustrating a shape in which a film thickness of the burial layer increases.

In addition, in a case where a burial film thickness is made to be large in the burial step of the present embodiment, the uppermost portion of the burial layer is higher than the lowermost portion of the upper clad layer outside the eaves as shown in FIG. 5. Needless to say, characteristics of the laser do not vary even in this shape.

Although, in the present embodiment, the doping concentration of the p type InP burial layer 9 is $3 \times 10^{17}$ cm$^{-3}$, the doping concentration is preferably $0.7 \times 10^{17}$ cm$^{-3}$ to $1.1 \times 10^{18}$ cm$^{-3}$, in consideration of a blocking characteristic of a current from the underlying n type InP buffer layer 2 and diffusion of a p type dopant into the active layer.

Figure 6:
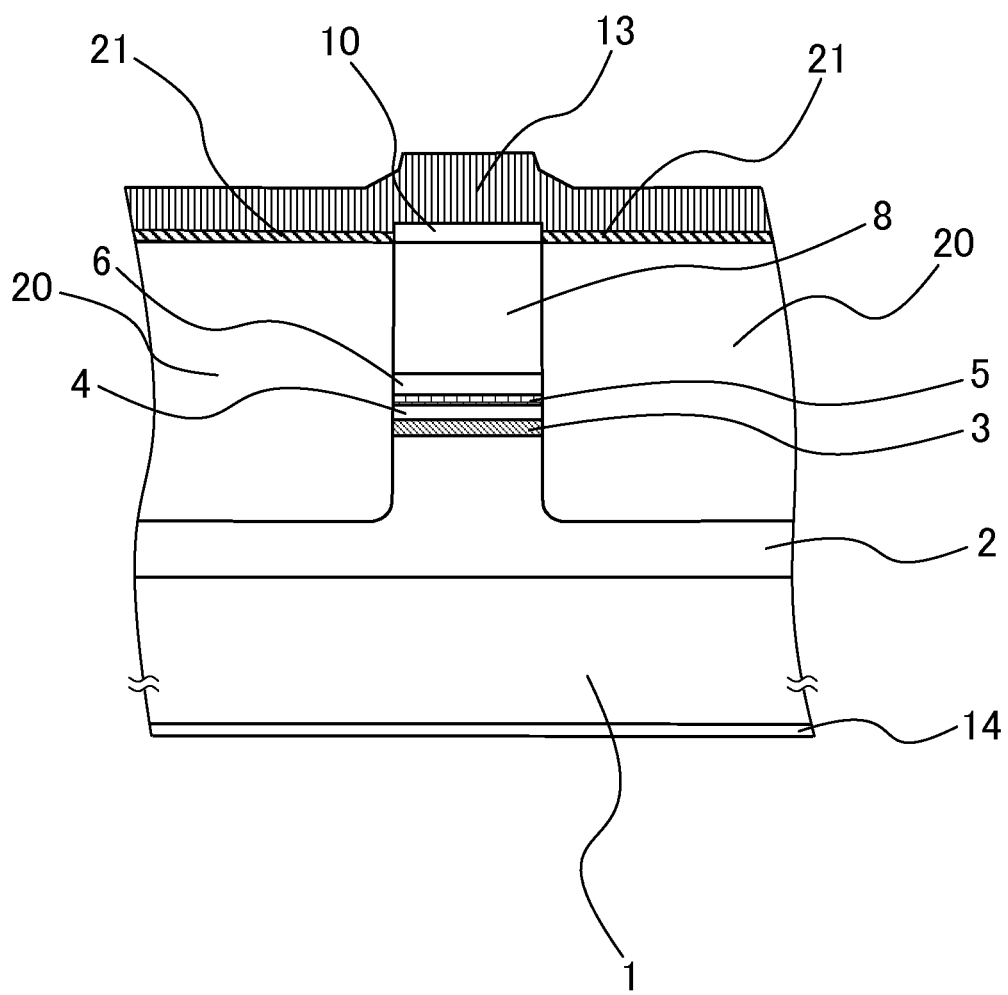
FIG. 6 is a diagram illustrating a cross-section of a semi-insulating semiconductor BH laser device having an InGaAlAs-MQW active layer.
Figure 7:
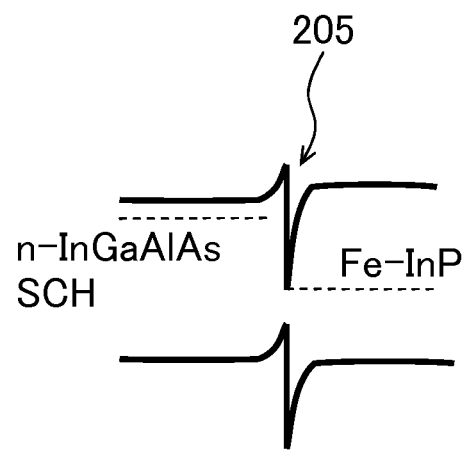
FIG. 7 is a band structure diagram of a region over an interface between an n type InGaAlAs-SCH layer and an Fe-doped InP burial layer.

Here, differences from the BH laser in the related art will be compared. FIG. 6 shows a semi-insulating semiconductor BH laser having an InGaAlAs-MQW active layer as disclosed in Non-Patent Document 3. In FIG. 6, the meanings of the reference numerals are the same as in FIG. 2 except for an InP layer 20 of a semi-insulating semiconductor doped with Fe, and an SiO$_2$ protective layer 21. FIG. 7 is a band structure diagram of a region over an interface between the n type InGaAlAs-SCH layer 3 and the InP layer 20. FIG. 7 is a band structure diagram illustrating a state where voltages are applied to the semiconductor laser and a current flows therethrough. Therefore, the Fermi levels of the Fe—InP layer and the n type InGaAlAs-SCH layer, respectively indicated by the dotted lines, do not conform, and the latter is higher. Since the barrier layer or the SCH layer is selected such that a band gap is great, band discontinuity between both of them is of Type-II. In this case, a notch 205 occurs on a conduction band side of the interface and is deepened by applying voltages. Therefore, it is considered that Fe—InP generally expresses a semi-insulating property for electrons but electrons leak through the notch 205 at the interfaces of the Al-based semiconductor multi-layer films and flow toward a p side. This may be the reason why a threshold current is not reduced so much in the semi-insulating BH laser which uses InGaAlAs-MQW in the active layer. On the other hand, a p type InP layer is employed in the burial layer in the present embodiment.

Figure 8:
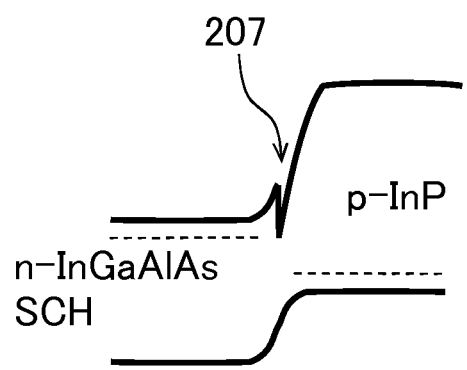
FIG. 8 is a band structure diagram of a region over an interface between an n type SCH layer and a p type InP burial layer.

FIG. 8 is an approximate band structure diagram over the interface between the n type SCH layer and the burial layer in this case. FIG. 8 shows a state where voltages are applied and a current flows in the same manner as the above description. Since the lower the Fermi level of p-InP, the smaller the notch 207 component at the interface, electrons flowing through the interface decrease. Further, a width of a path of a current flowing through the upper clad of the air ridge shape is very small since only the p type side walls of the reference numerals 5 to 7 are used, and thus a leakage current is very small.

In addition, in a case of the BH laser in the related art in which burial is performed using a p type or n type semiconductor, there is a problem in that parasitic capacitance due to a pn junction is large. In the laser according to the present embodiment, it has been proved that effective parasitic capacitance is small. In other words, a main parasitic capacitance in FIG. 2 is caused by the pn junction located between the n type InP buffer layer 2 and the p type InP burial layer 9. However, since the contact area between the p type InP burial layer 9 and the layers of the reference numerals 5 to 7 is small, a resistive component which is equivalently large is generated here. For this reason, an effective capacitive component is small. In a case of further reducing capacitance, an isolated groove may be formed so as to penetrate from the p type InP burial layer 9 to the n type InP buffer layer 2 at a location apart from the air ridge by about several μm.

Although, in the present embodiment, a p-InP is employed in the burial layer, a semi-insulating InP, that is, InP doped with Ru or Fe may be employed. In a case of layers where an active layer includes Al even in the semi-insulating InP doped with Ru or Fe, a semiconductor cannot be buried on the side walls of the mesa shape if there are no eaves. A case of using a semi-insulating semiconductor in the burial layer may be poorer than a case of performing burial using the p-InP layer as described above from the viewpoint of a leakage current. However, it is considered that a width of a path of a current flowing through the upper clad of the air ridge shape is very small since only the side walls of the p type layers of the reference numerals 5 to 7 are used, and thus a leakage current through the burial layer interface is smaller than in the semi-insulating semiconductor BH laser in the related art.

Although, in the present embodiment, the mesa width (here, the width of the etching stop layer 7) of the uppermost portion of the mesa shape under the air ridge is 1.52 μm which is a little larger than the lower end width of the air ridge, the width may be smaller than the lower end width of the air ridge. In a case where the width is smaller, the InP burial layer 9 comes into contact with the p type InP clad layer 8 so as to form a leakage path. However, if the contact width is small, a leakage current may be small. A mesa width of the uppermost portion of the mesa shape under the air ridge, which is preferable from the viewpoint of a leakage current, is −0.5 μm to +1.5 μm with respect to a mesa width of the lowermost portion of the air ridge. Here, the maximum value is determined in a range in which a current can be sufficiently diffused in the transverse direction and in a range in which light distributions can sufficiently arrive when the laser is oscillated. A more preferable range is −0.3 μm to +0.7 μm, and a leakage current is small in this range, and the maximum value is a range in which the light confinement coefficient increases.

In addition, a width of the air ridge lower end is preferably 0.7 μm to 2.5 μm in which a transverse mode of laser oscillation light is oscillated in a base mode. In consideration of the light confinement coefficient or resistance of laser elements, a width thereof is more preferably 0.9 μm to 1.8 μm.

In the present embodiment, since the sides of the Al-based active layer are buried in the semiconductor, the number of defective crystals at the interface is very small, and thus long-term reliability can be obtained. Since defective crystals remain due to forming a current blocking layer through ion implantation, it is difficult to realize long-term reliability for twenty years which is requested for use in optical fiber communication.

In the element in which the resonator length is 200 μm, a front end surface has reflectance of 70%, and a rear end surface has reflectance of 90%, and on which the excellent leakage current blocking characteristics of the present invention is reflected, a low threshold current of 1.5 mA at 25° C. which is room temperature could be obtained. In addition, a low threshold current of 3.8 mA was obtained at a high temperature of 85° C. A characteristic temperature of the threshold current was 65K which was a favorable value regardless of a small threshold current.

The slope efficiencies were 0.28 W/A and 0.25 W/A at 25° C. and 85° C., respectively, which were favorable.

In addition, slopes of the relaxation oscillation frequency fr relative to the square root of a driving current were 3.4 GHz/mA$^{1/2}$ and 3.2 GHz/mA$^{1/2}$ at 25° C. and 85° C., respectively, and good characteristics were obtained. Further, the estimated lifetime at 85° C. was 3.2×10$^5$ hours, and high reliability could be obtained.

Although, in the description hitherto regarding Embodiment 1, a Fabry-Perot laser in which high reflection films are employed on both-end surfaces of the laser has been described, the present invention may be applied to a DFB laser. The diffraction grating is formed by engraving, for example, the etching stop layer 7 up to a region which does not reach the bottom thereof. In this case, the diffraction grating is formed by engraving the p type InGaAsP etching stop layer 7 of which the thickness is 80 nm, up to 50 nm through dry etching and wet etching. The present DFB laser employs a diffraction grating of a 200 nm cycle in which the resonator length is 200 μm, non-reflection coating of 0.1% or less is performed on a front end surface, high reflection coating of 90% is performed on a rear end surface, and λ/4 shift is provided at a position of 60 μm from the rear end surface. In the present DFB laser, threshold currents were 1.7 mA and 4.5 mA at 25° C. and 85° C., respectively, and thus low threshold currents could be obtained. A characteristic temperature was 62K which was a favorable value regardless of a small threshold current. The slope efficiencies were 0.25 W/A and 0.22 W/A at 25° C. and 85° C., respectively, which were favorable. In addition, slopes of the relaxation oscillation frequency fr relative to the square root of a driving current were 4.2 GHz/mA$^{1/2}$ and 3.5 GHz/mA$^{1/2}$ at 25° C. and 85° C., respectively, and good characteristics were obtained. Further, the estimated lifetime at 85° C. was 2.4×10$^5$ hours, and high reliability could be obtained. Although, in this example, the diffraction grating is directly formed in the InGaAsP etching stop layer, a coupling coefficient of the diffraction grating may be improved by changing a composition wavelength at a thickness at which the diffraction grating is engraved. In addition, the same effect can be achieved even using a so-called floating type diffraction grating in which the diffraction grating is formed inside the upper InP clad layer.

[Embodiment 2]

Figure 9:
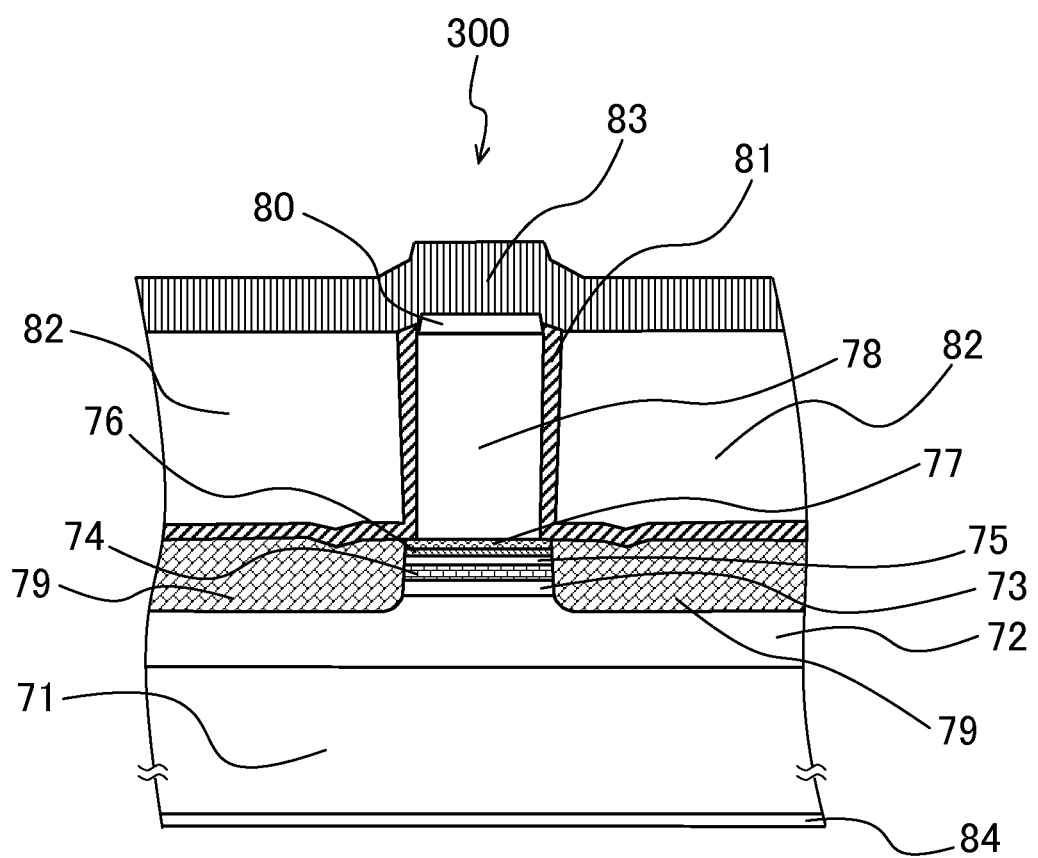
FIG. 9 is a cross-sectional view in the same view as in FIG. 2 in a semiconductor laser device according to Embodiment 2.

FIG. 9 is a diagram illustrating a semiconductor laser device 300 which is an optical semiconductor device according to Embodiment 2 of the present invention, and is a schematic diagram of the cross-section perpendicular to an optical axis of a DFB semiconductor laser which is oscillated in a 1.3 μm band of an optical fiber communication transmission light source. As shown in this figure, the semiconductor laser device 300 includes a p type InP substrate 71; a p type InP buffer layer 72 which is a lower clad layer of which the doping concentration is 1×10$^{18}$ cm$^{-3}$ and the thickness is 2 μm; a p type InAlAs electron stop layer 73 of which the doping concentration is 1×10$^{18}$ cm$^{-3}$ and the thickness is 50 nm; a p type InGaAlAs-SCH layer 74, disposed under MQW, of which the doping concentration is 1×10$^{18}$ cm$^{-3}$, the thickness is 50 nm, and the composition wavelength is 0.94 μm; a strained InGaAlAs-MQW layer 75 which has a well layer 9 nm thick and a barrier layer 10 nm thick in five cycles and is oscillated in a 1.3 μm band; an n type InGaAlAs-SCH layer 76 of which the doping concentration is 1×10$^{18}$ cm$^{-3}$, the thickness is 50 nm, and the composition wavelength is 1.0 μm to 1.15 μm; n type semiconductor multi-layer films 77 such as an etching stop layer and a diffraction grating layer; an n type InP clad layer 78 of the doping concentration 1×10$^{18}$ cm$^{-3}$ which is an upper clad layer and forms an air ridge of the height 1.6 μm from the upper clad layer; InP burial multi-layers 79; an n-InGaAs contact layer 80; an SiO$_2$ insulating layer 81; an organic insulating film 82 such as polyimide; an n type electrode 83 formed of Ti/Pt/Au; and a p type electrode 84 which uses AuZn-based elements in a contact electrode. Here, the width of the lower end of the air ridge is 1.5 μm, and the organic insulating film 82 may use an inorganic material as long as it shows a low stress. Here, the n type semiconductor multi-layer films 77 are n type semiconductor layers having a composition different from that of the n type InP clad layer 78 and including an etching stop layer 77a described later.

Figure 10A:
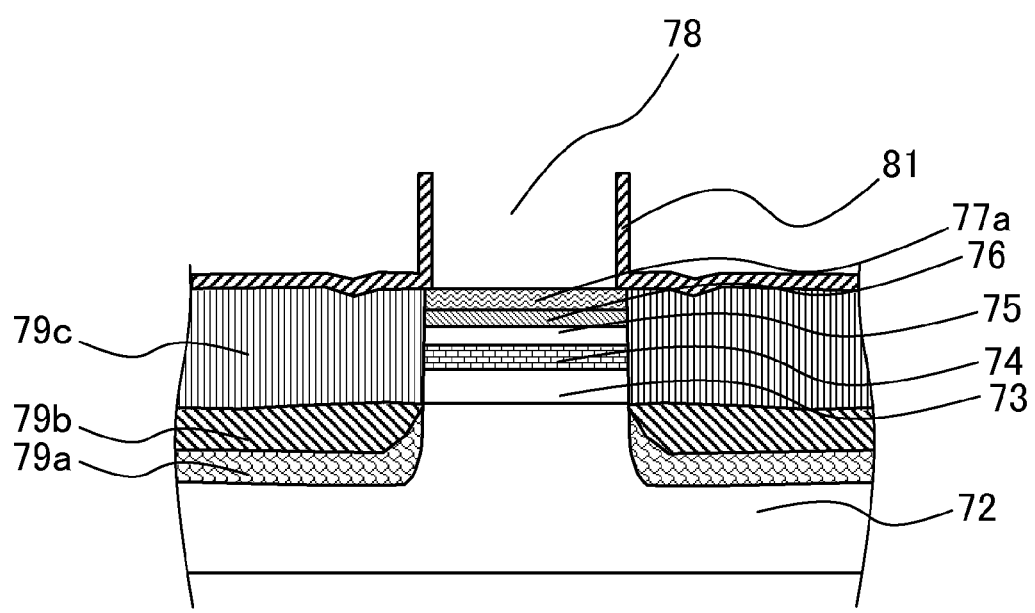
FIG. 10A is a detailed diagram illustrating a cross-section in which there is a diffraction grating in Embodiment 2.
Figure 10B:
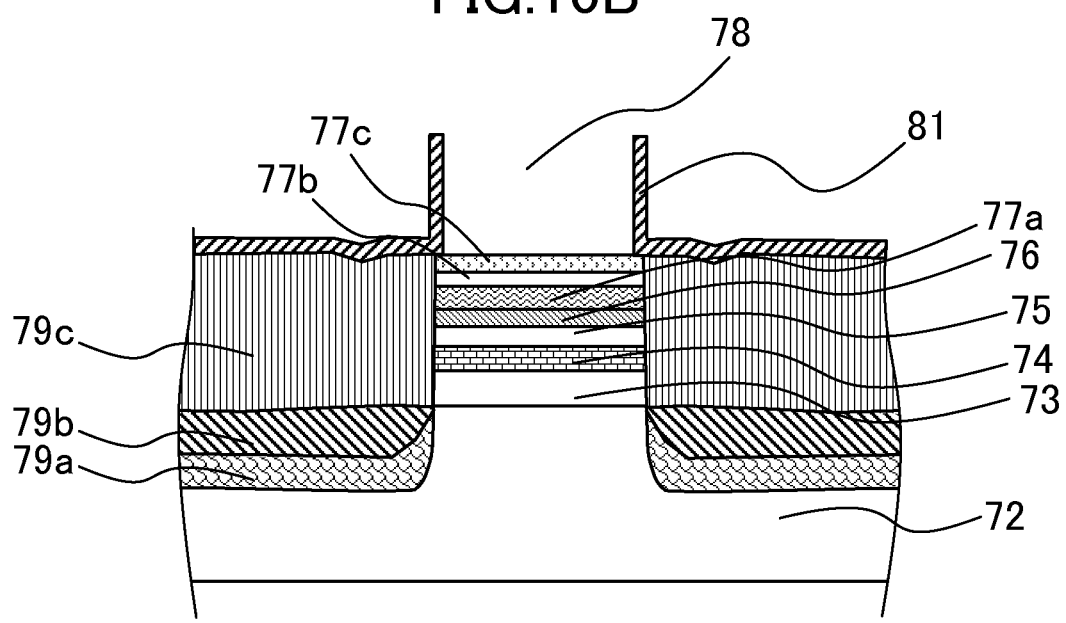
FIG. 10B is a detailed diagram illustrating a cross-section in which there is no diffraction grating in Embodiment 2.
Figure 11:
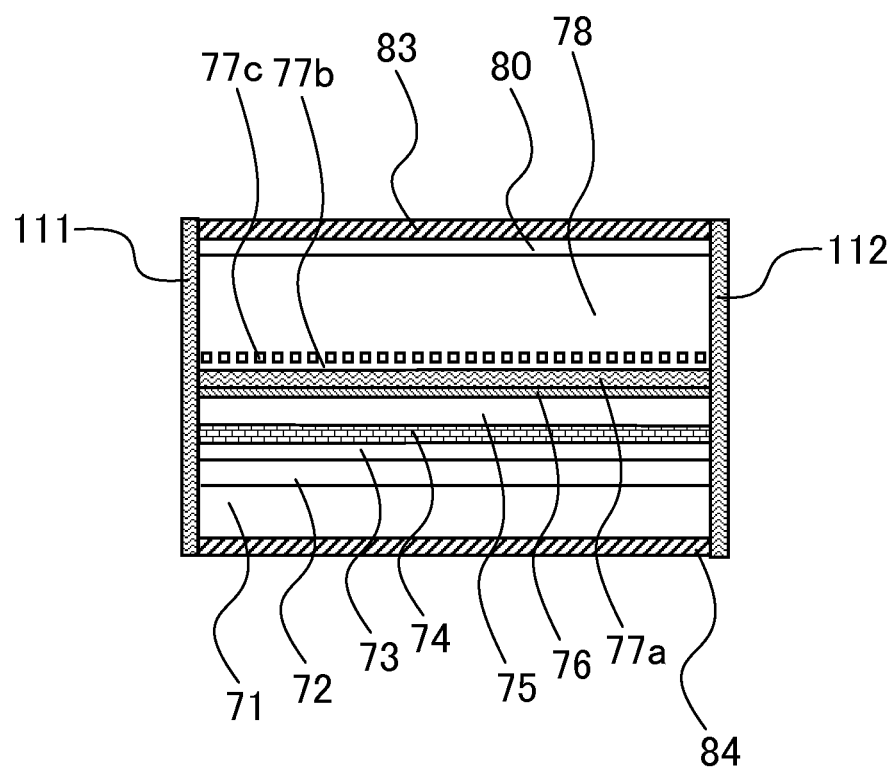
FIG. 11 is a diagram illustrating a longitudinal cross-sectional structure which is cut in parallel to an optical axis direction in Embodiment 2.

FIGS. 10A and 10B are diagrams illustrating a multi-layer structure around a diffraction grating and a burial layer in detail. FIG. 10A is a cross-sectional view in which there is a diffraction grating, FIG. 10B is a cross-sectional view in which there is no diffraction grating, and the structures shown in FIGS. 10A and 10B are formed in a cycle of 200 nm (every 100 nm). As shown in FIGS. 10A and 10B, the n type semiconductor multi-layer films 77 of FIG. 9 include three layers, an etching stop layer 77a, made of n type InGaAsP or InGaAlAs, of which the thickness is 30 nm and the doping concentration is 1×10$^{18}$ cm$^{-3}$; an n type InP spacer layer 77b of which the thickness is 10 nm and the doping concentration is 1×10$^{18}$ cm$^{-3}$; and an n type InGaAsP diffraction grating layer 77c of which the thickness is 50 nm and the doping concentration is 1×10$^{18}$ cm$^{-3}$. This diffraction grating is a so-called floating type diffraction grating, and has a structure in which an InGaAsP diffraction grating floats inside InP. In other words, a longitudinal cross-sectional structure which is cut in parallel to the optical axis direction at the center of the air ridge stripe is as in FIG. 11. In the longitudinal cross-sectional structure, the n type InP spacer layer 77b is connected to the n type InP clad layer 78, and thereby such a structure where the n type InGaAsP diffraction grating layer 77c floats in the InP layer is formed. Upon comparison of FIG. 10A with FIG. 10B, the height of the bottom portion of the air ridge stripe is different depending on the diffraction grating layer 77c and the spacer layer 77b. Therefore, in a case where the above-described eaves are formed according to this structure, the eaves undulate in a direction parallel to the optical axis direction. Even in these eaves, a burial shape or characteristic does not vary.

Figure 12:
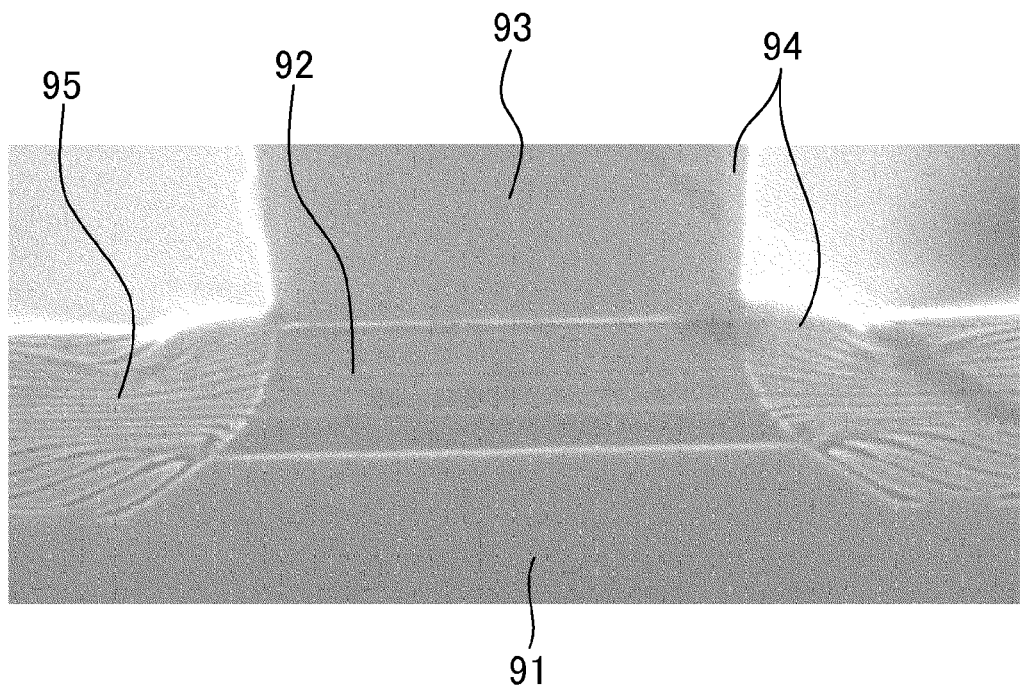
FIG. 12 is a diagram illustrating an electron microscopic picture of a cross-section which is perpendicular to laser light around the burial layer.

As shown in FIGS. 10A and 10B, the InP burial multi-layers 79 of FIG. 9 include three layers, an n type InP burial layer 79a of which the doping concentration is 1×10$^{18}$ cm$^{-3}$ and the thickness is 70 nm; an Ru-doped InP burial layer 79b of which the doping concentration is 5×10$^{17}$ cm$^{-3}$ and the thickness is 150 nm; and a p type InP burial layer 79c of which the doping concentration is 5×10$^{17}$ cm$^{-3}$ and the thickness is 300 nm. As shown in FIGS. 10A and 10B, the InP burial multi-layers 79 of the present embodiment are characterized in that the n type InP burial layer 79a and the Ru-doped InP burial layer 79b are disposed on a lower side than the InAlAs electron stop layer 73. In relation to the structure of the present invention, a burial shape has been studied in detail. FIG. 12 shows an example of the test result, and is an enlarged view of the vicinity of the burial layer portion of the electron microscopic picture, observed from a cross-section perpendicular to the direction of the air ridge stripe. This picture shows the test result manufactured on the n type InP substrate as in Embodiment 1, and shows an n type InP buffer layer 91, an Al-based multi-layer films 92 made of InGaAlAs or InAlAs, a p type InP clad layer 93, and an SiO$_2$ mask 94. Although direct discrimination is difficult from this picture, as can be seen from the burial shape, eaves of about 300 nm are formed outside both lower ends of the air ridge stripe. A burial layer 95 includes InP and InGaAs which are periodically multi-layered such that the burial shape can be understood well. As shown in FIG. 12, it has been initially found that the burial layer 95 is first buried up to the lower end of the Al-based multi-layer films 92, and then buries the side walls of the Al-based multi-layer films so as to be approximately planarized. As described above, in the structure in the related art, the burial layer was formed on all side walls including the active layer from an initial stage of the growth as in Patent Document 2. The burial multi-layer configuration was possible as in FIGS. 10A and 10B from this characteristic growth procedure. In addition, as can be seen from this picture, the lateral centers conform to each other with respect to the air ridge stripe by reflecting the self-alignment process, and the Al-based multi-layer films and the underlying InP layer are formed in a mesa shape.

In addition, a feature of the present structure is that approximately planarized growth is performed from the Al-based multi-layer films. Therefore, in the present embodiment, there can also be an easily and favorably reproduced configuration in which the n type InP burial layer 79a is under Al-based layers, the Ru-doped InP burial layer 79b is disposed up to the Al-based semiconductor film under the MQW active layer, and the p type InP burial layer 79c is disposed thereon.

According to the burial multi-layer structure of the present embodiment, holes which enter the burial layer from the p type InP buffer layer are blocked by the n type InP burial layer 79a, and electrons from the n type semiconductor layers such as the n type InGaAlAs-SCH layer 76 and the n type semiconductor multi-layer films 77 are blocked by the p type InP burial layer. In addition, since parasitic capacitance generated in the burial layer can be effectively reduced by the high-resistance Ru-doped layer, it is possible to implement a DFB laser having a low threshold current and high speed. In the DFB laser of the present embodiment, non-reflection coating of 0.1% or less is performed on the front end surface, and high reflection coating of 95% is performed on the rear end surface. A diffraction grating structure is formed in which the resonator length is 200 µm, and λ/4 shift is provided at a position of 40 µm from the rear end surface. In the present element, threshold currents were 1.6 mA and 4.2 mA at 25° C. and 85° C., respectively, and thus low threshold currents could be obtained. A characteristic temperature of the threshold current was 62K which was a favorable value regardless of a small threshold current.

The slope efficiencies were 0.22 W/A and 0.19 W/A at 25° C. and 85° C., respectively, which were favorable. In addition, slopes of the relaxation oscillation frequency fr relative to the square root of a driving current were 5.2 GHz/mA$^{1/2}$ and 4.1 GHz/mA$^{1/2}$ at 25° C. and 85° C., respectively, and good characteristics were obtained. Further, the estimated lifetime at 85° C. was 1.9×10$^5$ hours, and high reliability could be obtained.

Figure 13:
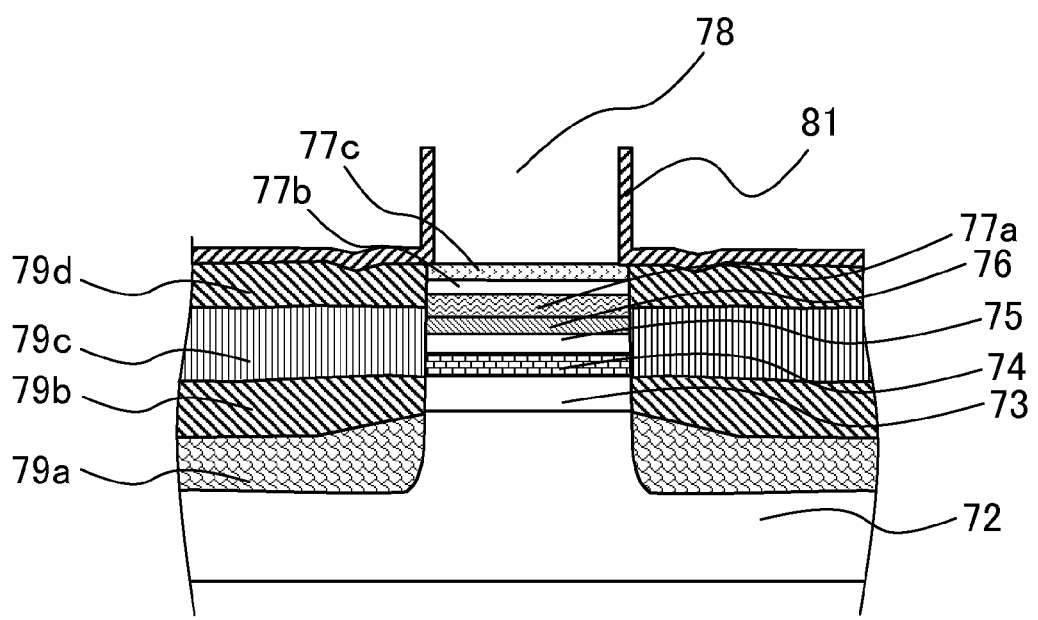
FIG. 13 is a cross-sectional view illustrating a case where a burial layer is formed of four layers as a modified example of Embodiment 2.

Although, in the present embodiment, the burial layer is formed of three layers, an n type InP burial layer may be disposed on a lower side than the Al-based multi-layer films, and an Ru-doped InP layer may be disposed on the side walls of the Al-based multi-layer films. Alternatively, as shown in FIG. 13, there may be a four-layer configuration in which the n type InP burial layer 79a is disposed on a lower side than the Al-based multi-layer films, the Ru-doped InP burial layer 79b is disposed on a portion of the side walls of the p type Al-based multi-layer films, the p type InP burial layer 79c is disposed on the side walls of the Al-based multi-layer films including the MQW active layer, and the Ru-doped InP burial layer 79d buries a portion of the side walls of the n type multi-layer films. In addition, although the floating type diffraction grating is employed as a diffraction grating layer in the present embodiment, the InGaAsP layer which is grown following the InGaAsP etching stop layer may be employed as a diffraction grating layer as in Embodiment 1.

[Embodiment 3]

Figure 14:
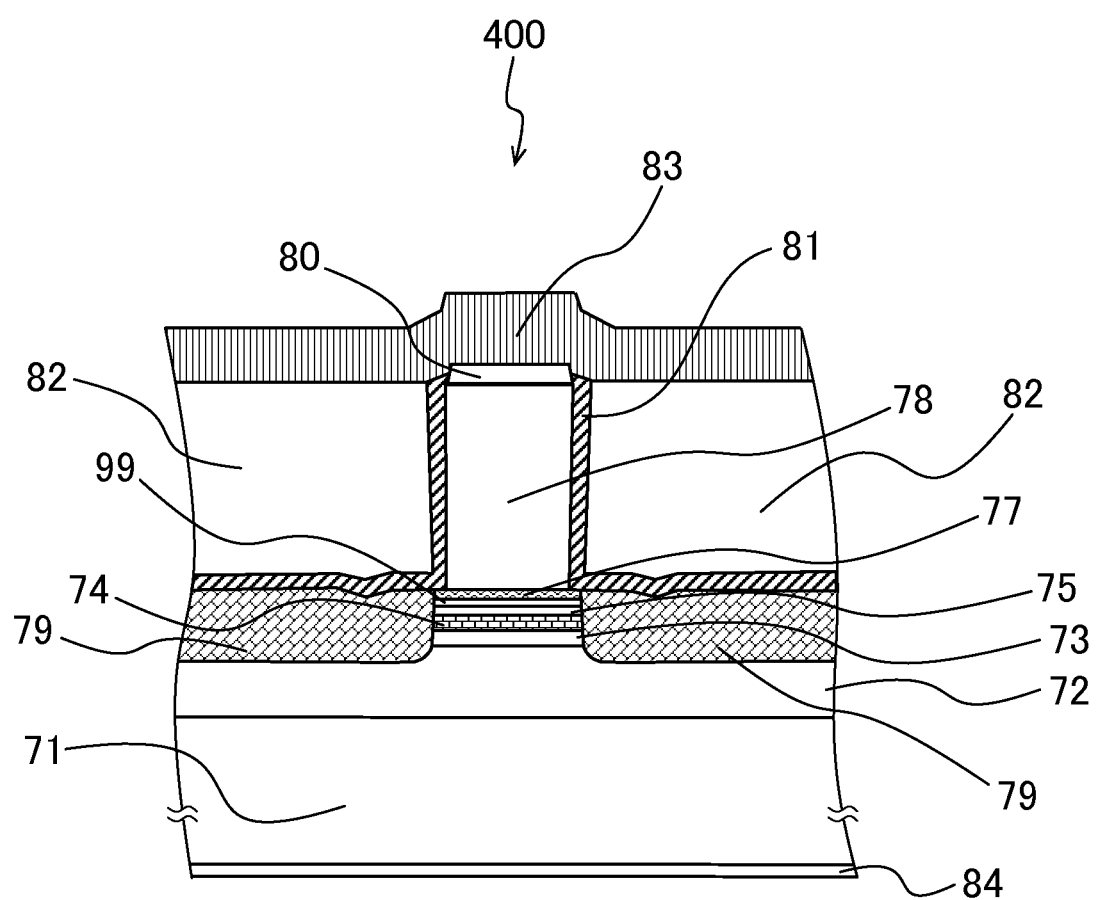
FIG. 14 is a cross-sectional view in the same view as in FIG. 2 in a semiconductor laser device of Embodiment 3.

FIG. 14 is a diagram illustrating a semiconductor laser device 400 which is an optical semiconductor device according to Embodiment 3 of the present invention, and is a schematic diagram of the cross-section perpendicular to an optical axis of a DFB semiconductor laser which is oscillated in a 1.3 µm band of an optical fiber communication transmission light source. The present embodiment is similar to Embodiment 2, and relates to a DFB laser formed on the p type InP substrate 71. A difference is that an n type SCH layer 99 is made of InGaAsP. The n type SCH layer 99 is made of not InGaAlAs but InGaAsP, thus a band structure of the interface with the burial layer is not of Type-II shown in FIG. 7 or 8 but Type-I, and thereby electrons on the conduction band side in the SCH layer are efficiently confined without leaking to the burial layer. The burial layer may have the shift burial structure described in Embodiment 2, and favorably constricts electrons therein according to the Type-I structure. Needless to say, a diffraction grating structure may employ a floating structure or a structure in which an InGaAsP layer grown following an InGaAsP etching stop layer is employed as a diffraction grating.

In the DFB laser of the present embodiment, non-reflection coating of 0.1% or less is performed on the front end surface, and high reflection coating of 90% is performed on the rear end surface. A diffraction grating structure is formed in which the resonator length is 200 µm, and λ/4 shift is provided at a position of 35 µm from the rear end surface. In the present element, threshold currents were 1.2 mA and 3.1 mA at 25° C. and 85° C., respectively, and thus low threshold currents could be obtained. A characteristic temperature of the threshold current was 63K which was a favorable value regardless of a small threshold current.

The slope efficiencies were 0.21 W/A and 0.18 W/A at 25° C. and 85° C., respectively, which were favorable.

In addition, slopes of the relaxation oscillation frequency fr relative to the square root of a driving current were 5.8 GHz/mA$^{1/2}$ and 4.5 GHz/mA$^{1/2}$ at 25° C. and 85° C., respectively, and good characteristics were obtained. Further, the estimated lifetime at 85° C. was 2.7×10$^5$ hours, and high reliability could be obtained.

[Embodiment 4]

Figure 15:
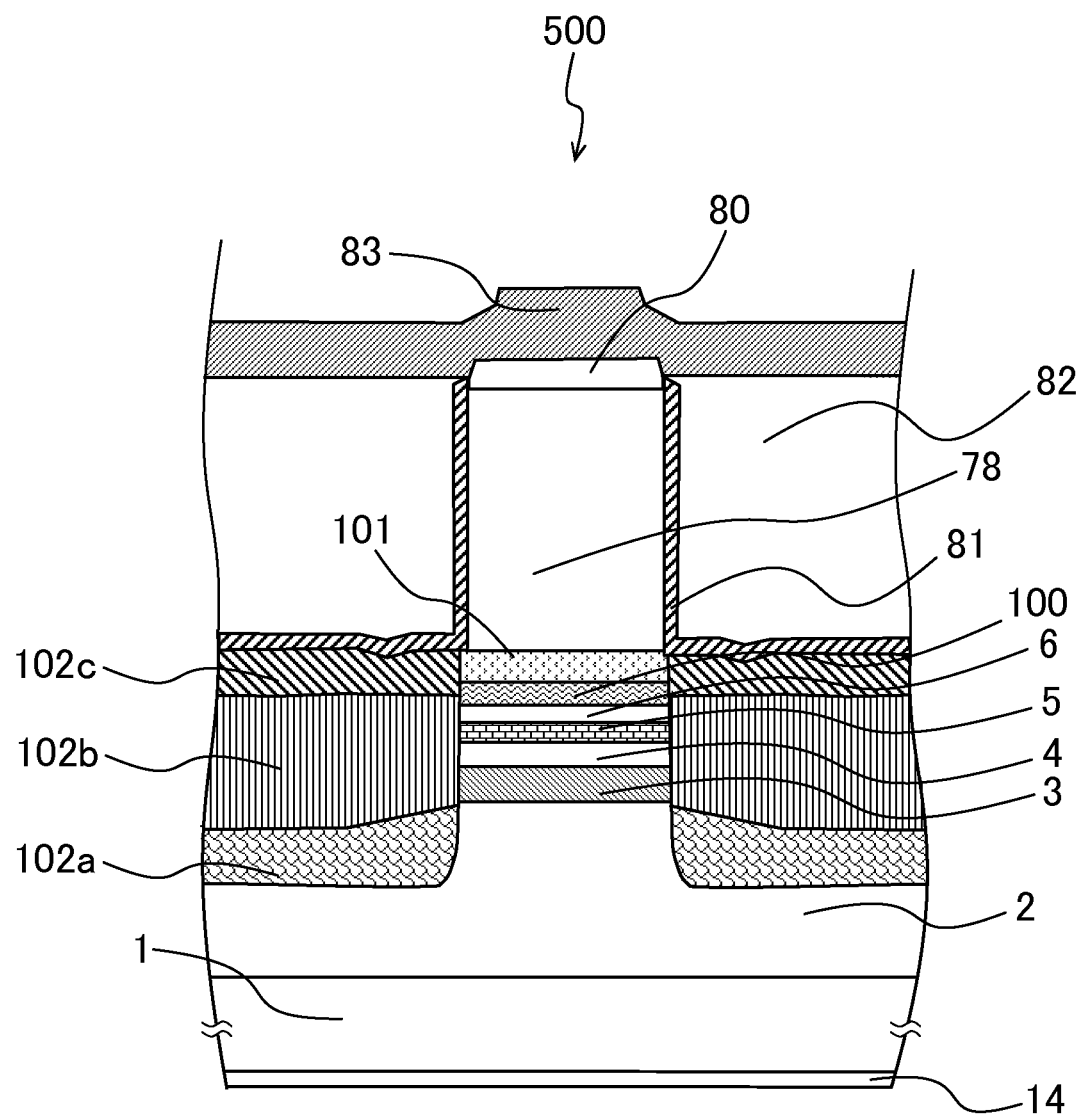
FIG. 15 is a cross-sectional view in the same view as in FIG. 2 in a semiconductor laser device of Embodiment 4.

FIG. 15 is a diagram illustrating a semiconductor laser device 500 which is an optical semiconductor device according to Embodiment 4 of the present invention, and is a schematic diagram of the cross-section perpendicular to an optical axis of a DFB semiconductor laser which is oscillated in a 1.3 µm band of an optical fiber communication transmission light source. As shown in this figure, the semiconductor laser device 500 includes; an n type InP buffer layer 2 which is formed on an n type InP substrate 1 and is a lower clad layer of which the doping concentration is 1×10$^{18}$ cm$^{-3}$ and the thickness is 500 nm; an n type InGaAlAs-SCH layer 3, disposed under MQW, of which the doping concentration is 1×10$^{18}$ cm$^{-3}$, the thickness is 100 nm, and the composition wavelength is 0.93 µm; a strained InGaAlAs-MQW layer 4 which has a well layer 5.5 nm thick and a barrier layer 7 nm thick in seven cycles and is oscillated in a 1.3 µm band; a p type InGaAlAs-SCH layer 5 of which the doping concentration is 8×10$^{17}$ cm$^{-3}$, the thickness is 30 nm, and the composition wavelength is 0.93 µm; a p type InAlAs electron stop layer 6 of which the doping concentration is 1×10$^{18}$ cm$^{-3}$ and the thickness is 10 nm to 50 nm; a p type InGaAlAs layer 100 which is 30 nm thick and is doped in a high concentration of 1.5×10$^{18}$ cm$^{-3}$; an n type InGaAsP layer 101 with the thickness of 80 nm in which an uneven diffraction grating with the height of 40 nm is formed so as to be perpendicular (parallel to the figure surface of FIG. 15) to the optical axis direction on a portion of the upper part doped in a high concentration of $2\times10^{18}$ cm$^{-3}$; an n type InP clad layer 78 with an air ridge shape; InP burial multi-layers 102; an n-InGaAs contact layer 80; an SiO$_2$ insulating film 81; an organic insulating layer 12 such as polyimide; an n type electrode 83 formed of Ti/Pt/Au; and an n type electrode 14 which uses AuGe-based elements in a contact electrode. Here, the p type InGaAlAs layer 100 and the n type InGaAsP layer 101 are n type semiconductor layers having a composition different from that of the n type InP clad layer 78.

Here, the p type InGaAlAs layer 100 and the n type InGaAsP layer 101 form a tunnel junction, and, particularly, since low junction resistance can be realized by increasing the doping concentration around the interface therebetween up to of $1\times10^{19=-3}$, it is possible to further decrease resistance of the entire element than a case where the upper clad layer of the air ridge portion as a p type layer. Thereby, it is possible to reduce an RC time constant caused by a resistor and a parasitic capacitor such as a pad, and to thus further suppress heat emission when a current is injected. Here, the width of the lower end of the air ridge is 1.5 μm, and the organic insulating film 82 may use an inorganic material as long as it shows a low stress.

The InP burial multi-layers 102a, 102b and 103c include three layers, a semi-insulating InP burial layer 102a which is doped with Ru and is 100 nm thick; a p type InP burial layer 102b of which the doping concentration is $5\times10^{17}$ cm$^{-3}$ and the thickness is 200 nm; and a semi-insulating InP burial layer 102c which is doped with Ru and is 100 nm thick.

In the present embodiment, since the width of the tunnel junction region is constricted by the Ru—InP burial layers, favorable tunnel junction characteristics can be obtained, and thus it is possible to implement a semiconductor laser with low element resistance. In the DFB laser of the present embodiment, non-reflection coating of 0.1% or less is performed on the front end surface, and high reflection coating of 95% is performed on the rear end surface. A diffraction grating structure is formed in which the resonator length is 200 μm, and λ/4 shift is provided at a position of 35 μm from the rear end surface. In the present element, threshold currents were 1.4 mA and 4 mA at 25° C. and 85° C., respectively, and thus low threshold currents could be obtained. A characteristic temperature of the threshold current was 57K which was a favorable value regardless of a small threshold current. The slope efficiencies were 0.20 W/A and 0.16 W/A at 25° C. and 85° C., respectively, which were favorable. In addition, slopes of the relaxation oscillation frequency fr relative to the square root of a driving current were 5.4 GHz/mA$^{1/2}$ and 4.3 GHz/mA$^{1/2}$ at 25° C. and 85° C., respectively, and good characteristics were obtained. Further, the estimated lifetime at 85° C. was $1.2\times10^5$ hours, and high reliability could be obtained.

In addition, the effect can be achieved even in a case where a portion of or the overall tunnel junction of the present embodiment enters the air ridge. In addition, in the present embodiment, the n type layer of the tunnel junction is also used as the diffraction grating layer; however, needless to say, the same effect can be achieved even in a case where a floating type diffraction grating structure is separately employed. Further, although the p type layer of the tunnel junction uses InGaAlAs, it is possible to obtain favorable tunnel characteristics since Type-II junction band discontinuity of the tunnel junction increases if InGaAlAsSb is used.

Figure 16:
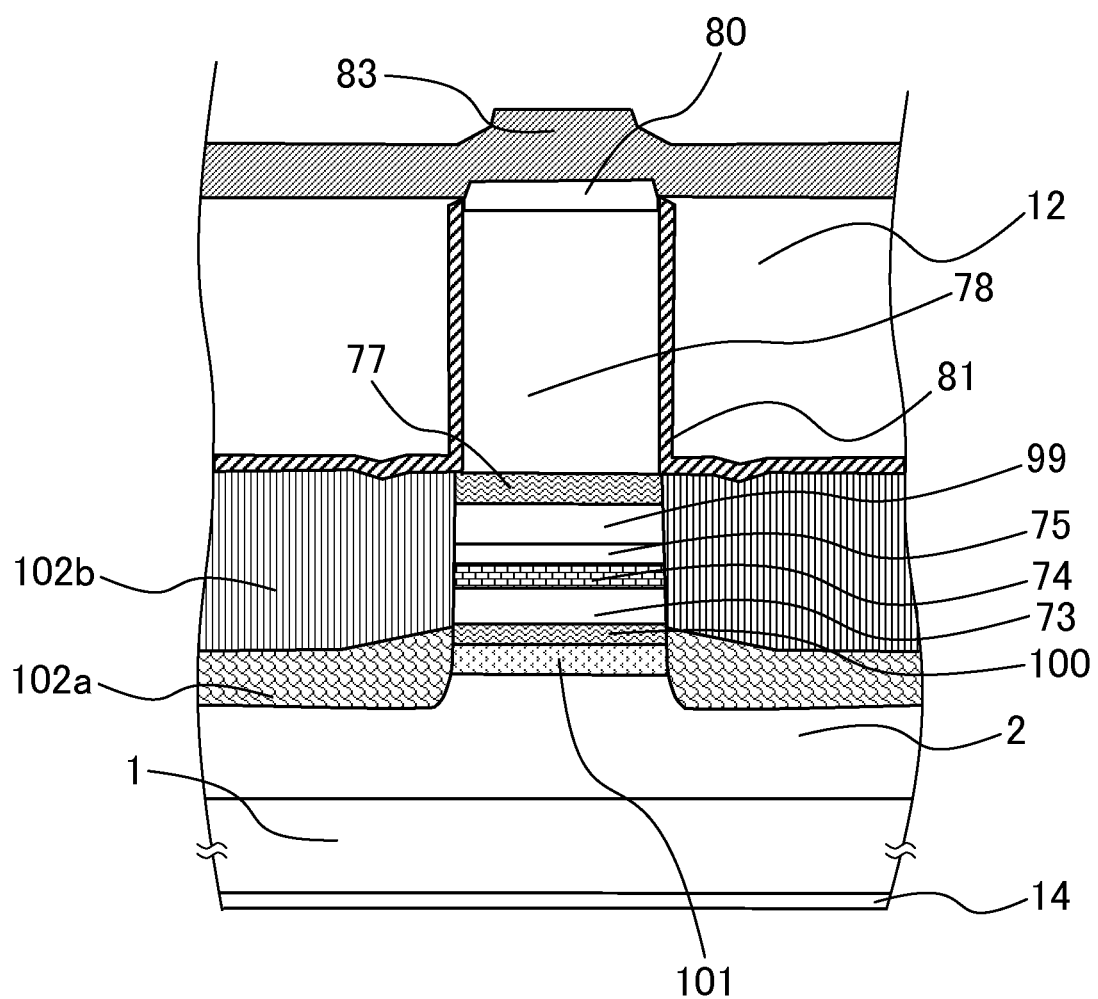
FIG. 16 is a diagram illustrating a case where a tunnel junction between the p type InGaAlAs layer and the n type InGaAsP layer is provided under the active layer as a modified example of Embodiment 4.

In addition, although the tunnel junction is provided on the active layer in the present embodiment, a structure may be employed in which the tunnel junction between the p type InGaAlAs layer 100 and the n type InGaAsP layer 101 may be provided under the active layer as shown in FIG. 16. In this case, the mesa shape portion located on the tunnel junction layer may employ the configuration of Embodiment 3 as in FIG. 16 or the configuration of Embodiment 2. Further, the side wall of the tunnel junction layer may be buried by the Ru-doped InP layer 102a as in FIG. 16, and a layer located thereon may be buried by the p type InP layer 102b.

[Embodiment 5]

Figure 17:
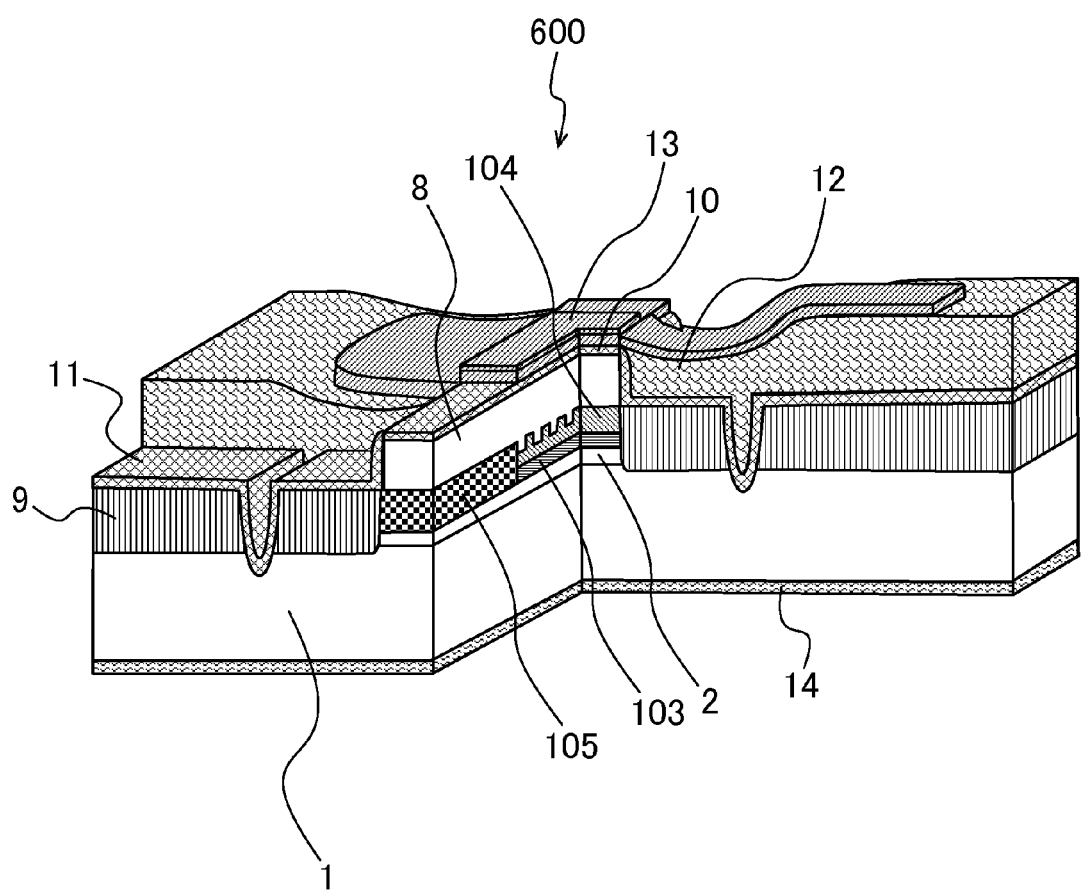
FIG. 17 is a bird's eye view illustrating a partial cross-section of a passive waveguide integrated short resonator DFB laser of a semiconductor laser device according to Embodiment 5.

FIG. 17 is a bird's eye view illustrating a partial cross-section of a passive waveguide integrated short resonator DFB laser of a semiconductor laser device 600 which is an optical semiconductor device according to Embodiment 5, and shows a portion of the notched half from the center of the laser stripe such that an internal structure can be understood. As shown in FIG. 17, the semiconductor laser device 600 includes an n type InP substrate 1; an n type InP buffer layer 2 which is a lower clad layer of which the doping concentration is $1\times10^{18}$ cm$^{-3}$ and the thickness is 500 nm; semiconductor multi-layer films 103 which are semiconductor multi-layer films including Al and having an MQW layer, an SCH layer provided on both sides thereof, an electron stop layer, and the like, and correspond to, for example, the reference numerals 3 to 6 of Embodiment 1; a p type InGaAsP etching stop and diffraction grating layer 104 with the thickness of 80 nm and the concentration of $8\times10^{17}$ cm$^{-3}$ in which an uneven diffraction grating with the height of 50 nm is formed on the upper part; a p type InP clad layer 8 of the doping concentration $1\times10^{18}$ cm$^{-3}$ which is an upper clad layer and forms an air ridge of the height 1.5 μm; a p-InP burial layer 9 with the doping concentration of $3\times10^{17}$ cm$^{-3}$ in which isolation grooves are formed at locations of 4 μm of both sides from and outside the air ridge; an InGaAs contact layer 10; an SiO$_2$ insulating film 11; an organic insulating film 12 such as polyimide; a p type electrode 13; and an n type electrode 14. Here, the width of the lower end of the air ridge is 1.4 μm, and the organic insulating film 12 may use an inorganic material as long as it shows a low stress. In addition, the above-described isolation groove is formed so as to achieve high speed and to further reduce capacitance. Here, the p type InGaAsP etching stop and diffraction grating layer 104 is a p type semiconductor layer having a composition different from that of the p type InP clad layer 8.

A non-reflection coating film is formed on an end surface where the undoped InGaAsP passive waveguide 105 is formed, and a high reflection coating film is formed on an opposite end surface where the semiconductor multi-layer films 103 including Al are formed. As a forming method of the element, the semiconductor layers including the semiconductor multi-layer films 103 and the p type InGaAsP etching stop and diffraction grating layer 104 are crystal-grown, and the passive waveguide 105 is crystal-grown. Successively, the diffraction grating is formed, and the p type InP clad layer 8 and the InGaAs contact layer 10 are crystal-grown. Next, in the same method as described in Embodiment 1, the air ridge stripe is formed, then eaves of SiO$_2$ are formed through self-alignment formation, and the p type InP burial layer 9 is crystal-grown and is buried after the semiconductor layer on both sides of the air ridge are etched. Even if there is the InGaAsP passive waveguide 105, it is possible to form the same burial type air ridge stripe structure as in Embodiment 1. Since the length Lc of the active layer can be shortened in the structure of the present embodiment, it is possible to increase the relaxation oscillation frequency as can be seen from Expression (1). Therefore, it is possible to perform a high speed operation.

In the present embodiment, the length of the active layer is 100 μm, and the length between the front and rear end surfaces including the InGaAsP passive waveguide 105 is 200 μm. In addition, a diffraction grating structure is formed in which λ/4 shift is provided at a position of 20 μm from the rear end surface. In the present element, threshold currents were 1.1 mA and 2.9 mA at 25° C. and 85° C., respectively, which were low threshold currents. A characteristic temperature of the threshold current was 62K which was a favorable value regardless of a small threshold current. The slope efficiencies were 0.26 W/A and 0.20 W/A at 25° C. and 85° C., respectively, which were favorable. In addition, slopes of the relaxation oscillation frequency fr relative to the square root of a driving current were 6.2 GHz/mA$^{1/2}$ and 4.5 GHz/mA$^{1/2}$ at 25° C. and 85° C., respectively, and good characteristics were obtained. Further, the estimated lifetime at 85° C. was 1.7× 10$^5$ hours, and high reliability could be obtained.

Although, in the present embodiment, the waveguide integrated short resonator DFB laser formed on the n-InP substrate has been described, a waveguide integrated short resonator DFB laser formed on the p-InP substrate can be manufactured in the same manner as in Embodiments 2 and 3. In addition, although the burial layer is a p-InP layer in the present embodiment, a semi-insulating InP layer doped with Ru or Fe may be buried, and a multi-layer structure of the InP layer with different conductivity types or semi-insulating may be employed. Further, even in a case of forming the element using a tunnel junction as in Embodiment 4, a favorable effect can be achieved, and, even using a floating type diffraction grating layer, the same effect can be achieved.

[Embodiment 6]

Figure 18:
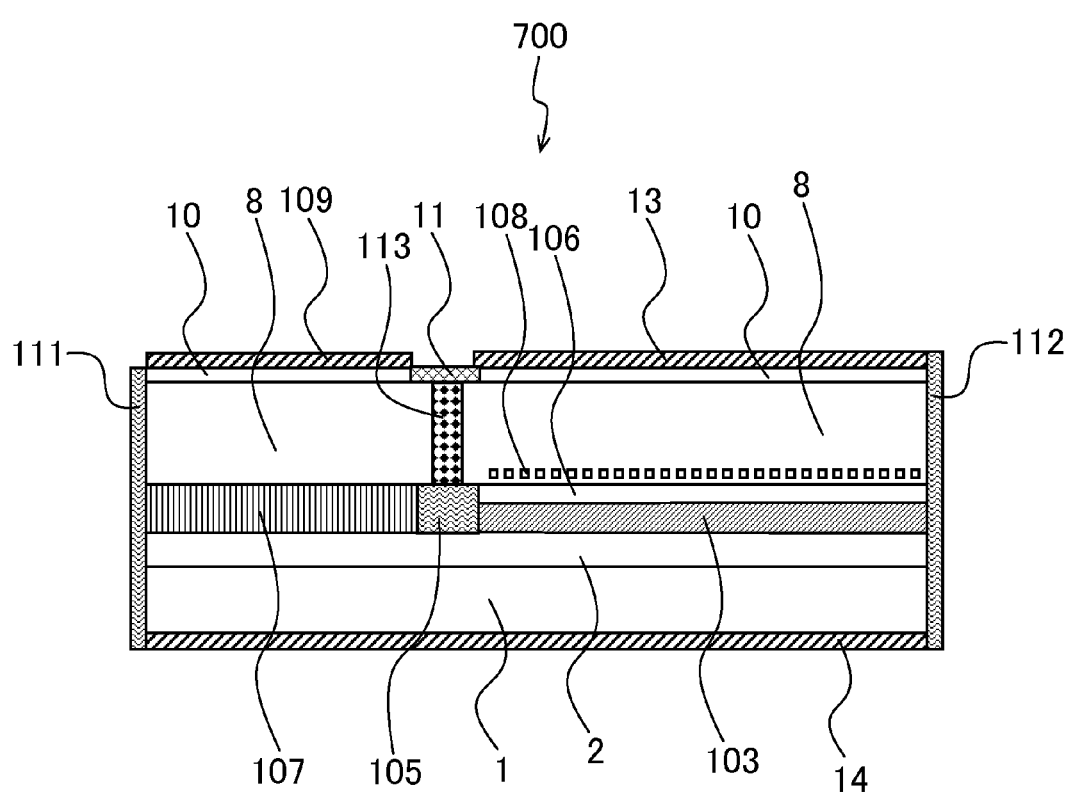
FIG. 18 is a cross-sectional view illustrating an EA-DFB laser device where a semiconductor laser of a semiconductor laser device according to Embodiment 6 and an absorption modulator are integrated.

FIG. 18 is a diagram illustrating an EA-DFB laser device 700 where a semiconductor laser of a semiconductor laser device which is an optical semiconductor device according to Embodiment 6 and an absorption modulator are integrated, and is a longitudinal cross-sectional view in which the central portion of the air ridge stripe is cut in parallel to the optical axis direction. As shown in FIG. 18, the EA-DFB laser device 700 includes an n type InP substrate 1; an n type InP buffer layer 2 which is a lower clad layer of which the doping concentration is 1×10$^{18}$ cm$^{-3}$ and the thickness is 800 nm; semiconductor multi-layer films 103 which are semiconductor multi-layer films including Al and having an MQW layer, an SCH layer provided on both sides thereof, an electron stop layer, and the like, and correspond to, for example, the reference numerals 3 to 6 of Embodiment 1; a p type InGaAsP or InGaAlAs etching stop layer 106 of which the doping concentration of 8×10$^{17}$ cm$^{-3}$ and the thickness is 30 nm; a floating type InGaAsP diffraction grating layer 108; a p type InP clad layer 8 of the doping concentration 1×10$^{18}$ cm$^{-3}$ which is an upper clad layer and forms an air ridge of the height 1.6 μm; an InGaAs contact layer 10; an SiO$_2$ insulating film 11; a p type electrode 13 of a laser region; an n type electrode 14; an undoped InGaAsP passive waveguide 105; an absorption modulator 107 of semiconductor multi-layer films in which an MQW of InGaAlAs includes Al interposed in the SCH layer; a non-reflection coating film 111; a high-reflection coating film 112; a p type electrode 109 of the absorption modulator; and a region 113 which electrically insulates the laser portion from the modulator portion and in which protons are ion-implanted into the upper clad layer 8. Here, the InGaAlAs etching stop layer 106 is a p type semiconductor layer having a composition different from that of the p type InP clad layer 8.

In the bird's eye view, the laser device has a structure similar to that shown in FIG. 17 of Embodiment 5. The upper clad layer 8 is formed in an air ridge stripe shape, and only the absorption modulator, the passive waveguide layer, and the laser portion are left directly under the air ridge stripe. In addition, both sides thereof are buried by the InP layer as in FIG. 17. However, in Embodiment 5, both the sides are buried by the p-type InP layer, whereas, in the present embodiment, both the sides are buried by the semi-insulating InP layer doped with Ru. This is because the absorption modulator is used in a state where a reverse bias is applied thereto. The absorption modulator has a burial structure, and thereby a loss of an effective electric field component applied to the MQW of the modulator is reduced. In addition, since the light confinement coefficient is larger than in the BH structure in the related art, it is possible to obtain a very high efficiency absorption modulator.

In the EA-DFB laser of the present embodiment, threshold currents were 4 mA at 25° C. and 8 mA at 85° C., which were very small in terms of the EA-DFB laser portion, and, it was possible to implement a favorable absorption modulator in which the cutoff frequency is 57 GHz at a driving voltage of 0.8 Vpp through an improvement in the light confinement coefficient and an improvement in the effective electric field of the EA portion. It was possible to obtain a favorable operation of the extinction ratio 8.7 dB at 50 Gb/s in an operation of 0.8 Vpp in a temperature range from 0° C. to 85° C. In addition, in an operation of 1.2 Vpp at 10 Gb/s, it was possible to obtain power penalty 1.2 dB in optical fiber transmission of 80 km up to a bit error rate of 10$^{-13}$. In addition, the reliability of the laser portion was 2.7×10$^5$ hours, the reliability of the absorption modulator portion was 4.7×10$^5$ hours, and thus very high reliability could be obtained.

Although, in the present embodiment, the EA-DFB laser formed on the n-InP substrate has been described, an EA-DFB laser formed on the p-InP substrate can be manufactured in the same manner as in Embodiments 2 and 3. In addition, although the burial layer is a semi-insulating InP layer doped with Ru in the present embodiment, a semi-insulating InP layer doped with Fe may be buried, and a multi-layer structure with different conductivity types or semi-insulating may be employed. Further, even in a case of forming the element using a tunnel junction as in Embodiment 4, a favorable effect can be achieved, and, even when the diffraction grating layer is not a floating type but is combined with the etching layer by forming a diffraction grating on a part of the upper portion of the etching stop layer, the same effect can be achieved.

In addition, although, in all the embodiments of the present invention, when the semiconductor layer including Al and having the active layer which is located directly under the air ridge mesa-stripe shape is formed in a mesa shape, the further underlying InP layer is also etched, the same effect can be achieved even in a shape in which the etching performed up to the semiconductor layer including Al.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An optical semiconductor device formed on an InP semiconductor substrate, comprising:
   a first clad layer of a first conductivity type and having an air ridge shape;
   a first conductivity type semiconductor layer disposed on a lower layer side which is the InP semiconductor substrate side of the first clad layer and including at least one layer having a composition different from a composition of the first clad layer;

Al-based semiconductor multi-layer films disposed on the lower layer side of the first conductivity type semiconductor layer, the AL-based semiconductor mutli-layer films being formed by overlapping a plurality of semiconductor layers including an Al element, and having a quantum well active layer;

a second clad layer disposed on the lower layer side of the Al-based semiconductor multi-layer films and is of a second conductivity type; and at least one burial semiconductor layer in contact with two opposite common side walls formed by the first conductivity type semiconductor layer and the Al-based semiconductor multi-layer films, wherein an end surface of an upper layer side of the burial semiconductor layer has a surface which has substantially the same height as an end surface of an upper surface side of the first conductivity type semiconductor layer, and a lower layer side thereof extends so as to cover at least the Al-based semiconductor multi-layer films.

2. The optical semiconductor device according to claim 1, further comprising:
   at least one lower-layer side burial layer formed on the lower layer side of the burial layer and is formed apart from the common side walls.

3. The optical semiconductor device according to claim 1, wherein the Al-based semiconductor multi-layer films include an SCH layer formed of an n-type InGaAsP layer.

4. The optical semiconductor device according to claim 1, wherein the burial layer is made of a p-type semiconductor, or is doped with Ru as a dopant.

5. The optical semiconductor device according to claim 1, wherein the first conductivity type semiconductor layer includes InGaAsP or InGaAlAs.

6. The optical semiconductor device according to claim 1, further comprising:
   an oxide film provided on the upper layer side of the burial semiconductor layer and the side surface of the first clad layer; and
   an organic insulating film or a low-stress inorganic insulating film provided so as to cover the side surface of the first clad layer on an upper layer side of the oxide film.

7. The optical semiconductor device according to claim 1, wherein a width of the first conductivity type semiconductor layer, a width of the Al-based semiconductor multi-layer films, and a width of the first clad layer, which are determined by a distance between the common side walls, are substantially the same.

8. An optical semiconductor device formed on an InP semiconductor substrate, comprising:
   a first clad layer of a first conductivity type and having an air ridge shape;
   a first conductivity type semiconductor layer disposed on a lower layer side which is the InP semiconductor substrate side of the first clad layer, the first conductivity type semiconductor layer including at least one layer having a composition different from a composition of the first clad layer;
   Al-based semiconductor multi-layer films disposed on the lower layer side of the first conductivity type semiconductor layer, the AL-based semiconductor multi-layer films being formed by overlapping a plurality of semiconductor layers including an Al element, and having a quantum well active layer;
   a second clad layer disposed on the lower layer side of the Al-based semiconductor multi-layer films and is of a second conductivity type; and
   a burial semiconductor layer in contact with two opposite common side walls formed by the first conductivity type semiconductor layer and the Al-based semiconductor multi-layer films,
   wherein a central axis of a shape formed by the first conductivity type semiconductor layer and the Al-based semiconductor multi-layer films interposed between the side walls is a central axis of a shape of the first clad layer.

9. The optical semiconductor device according to claim 8, further comprising:
   at least one lower-layer side burial layer formed on the lower layer side of the burial layer and is formed apart from the common side walls.

10. The optical semiconductor device according to claim 8, wherein the Al-based semiconductor multi-layer films include an SCH layer formed of an n type InGaAsP layer.

11. The optical semiconductor device according to claim 8, wherein the burial layer is made of a p type semiconductor, or is doped with Ru as a dopant.

12. The optical semiconductor device according to claim 8, wherein the first conductivity type semiconductor layer includes InGaAsP or InGaAlAs.

13. The optical semiconductor device according to claim 8, further comprising:
   an oxide film provided on the upper layer side of the burial semiconductor layer and the side surface of the first clad layer; and
   an organic insulating film or a low-stress inorganic insulating film provided so as to cover the side surface of the first clad layer on an upper layer side of the oxide film.

14. The optical semiconductor device according to claim 8, wherein a width of the first conductivity type semiconductor layer, a width of the Al-based semiconductor multi-layer films, and a width of the first clad layer, which are determined by a distance between the common side walls, are substantially the same.

* * * * *